(12) United States Patent
Ito et al.

(10) Patent No.: US 7,968,043 B2
(45) Date of Patent: Jun. 28, 2011

(54) CERAMIC SUBSTRATE PRODUCTION PROCESS AND CERAMIC SUBSTRATE PRODUCED USING THE PROCESS

(75) Inventors: Yuki Ito, Takatsuki (JP); Osamu Chikagawa, Yasu (JP); Tetsuya Ikeda, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 274 days.

(21) Appl. No.: 11/862,722

(22) Filed: Sep. 27, 2007

(65) Prior Publication Data
US 2008/0308976 A1   Dec. 18, 2008

Related U.S. Application Data

(63) Continuation of application No. PCT/JP2006/306553, filed on Mar. 29, 2006.

(30) Foreign Application Priority Data

Apr. 21, 2005  (JP) ................................. 2005-124112
Jul. 15, 2005  (JP) ................................. 2005-207699

(51) Int. Cl.
  *C04B 33/32*  (2006.01)
(52) U.S. Cl. .... 264/642; 156/60; 156/89.11; 156/89.12; 156/89.16; 156/285; 264/614
(58) Field of Classification Search .................. 264/642, 264/656, 667, 605, 614; 156/89.12, 60, 89.11, 156/89.16, 285
See application file for complete search history.

(56) References Cited

U.S. PATENT DOCUMENTS

| | | | | |
|---|---|---|---|---|
| 4,749,421 A | * | 6/1988 | Matsui et al. | 156/89.16 |
| 5,028,473 A | * | 7/1991 | Vitriol et al. | 428/137 |
| 5,379,017 A | * | 1/1995 | Katsuno | 338/332 |
| 6,562,372 B1 | * | 5/2003 | Yokoi et al. | 424/464 |
| 7,494,557 B1 | * | 2/2009 | Peterson | 156/89.11 |
| 2001/0022416 A1 | | 9/2001 | Harada et al. | |

(Continued)

FOREIGN PATENT DOCUMENTS
EP   0 581 294 A2   2/1994

(Continued)

OTHER PUBLICATIONS http://www.merriam-webster.com/dictionary/laminate.*

(Continued)

*Primary Examiner* — Richard Crispino
*Assistant Examiner* — Elizabeth Royston
(74) *Attorney, Agent, or Firm* — Keating & Bennett, LLP

(57) ABSTRACT

An auxiliary-layer-lined unfired ceramic body, having a step portion in a principal surface thereof, has an unfired ceramic body and an auxiliary layer which is adhered to one principal surface of the unfired ceramic body and which is made of a material that is substantially unsinterable at a temperature at which the unfired ceramic body is fired. The auxiliary-layer-lined unfired ceramic body is fired at a temperature at which the unfired ceramic body is sinterable but the auxiliary layer is substantially unsinterable, while the auxiliary layer remains adhered to the unfired ceramic body. A pressing operation is performed using a die having a projection placed on the side of the auxiliary-layer-lined unfired ceramic body retaining the auxiliary layer, so that the step portion, having a shape corresponding to the outer shape of the die projection, is formed in the side of the auxiliary-layer-lined unfired ceramic body retaining the auxiliary layer.

16 Claims, 18 Drawing Sheets

U.S. PATENT DOCUMENTS

| | | | |
|---|---|---|---|
| 2002/0070423 A1* | 6/2002 | Takafuji | 257/532 |
| 2002/0134488 A1* | 9/2002 | Harada et al. | 156/89.12 |
| 2004/0151925 A1* | 8/2004 | Inoue et al. | 428/469 |

FOREIGN PATENT DOCUMENTS

| | | |
|---|---|---|
| JP | 03-169097 A | 7/1991 |
| JP | 2001-230548 A | 8/2001 |
| JP | 2003-008217 A | 1/2003 |

OTHER PUBLICATIONS

Official communication issued in the International Application No. PCT/JP2006/306553, mailed on Jun. 20, 2006.

Official Communication issued in corresponding Chinese Patent Application No. 2006800134194, mailed on Jan. 29, 2010.

Official Communication issued in corresponding European Patent Application No. 06730501.1, mailed on Sep. 20, 2010.

* cited by examiner

CERAMIC SUBSTRATE PRODUCTION PROCESS AND CERAMIC SUBSTRATE PRODUCED USING THE PROCESS

BACKGROUND OF THE INVENTION

1. Field of the Invention

The present invention relates to a process for producing a ceramic substrate, and more particularly, to a ceramic substrate production process for producing a ceramic substrate having a step portion on at least one principal surface thereof, and also to a ceramic substrate produced by using the process.

2. Description of the Related Art

Ceramic substrates having step portions (typically, a cavity) provided on the surfaces thereof are known.

A process has been proposed in Japanese Unexamined Patent Application Publication No. 3-169097 for producing this type of ceramic substrate in which, as shown in FIGS. 26A, 26B, and 26C, a multilayered ceramic substrate having a step portion (cavity) is produced by superposing second ceramic sheets 52, each having an opening portion 53, on first ceramic sheets 51, followed by press-bonding, to thereby form a laminate structure 57. In this process, a plate member 54 (including a ceramic sheet 56 and another ceramic sheet 56 with a releasing agent 55) having a shape that is substantially identical to that of the opening portion 53 is placed in the opening portion 53 so that a surface 54a is slightly protruded from the surface of the laminate structure 57, and, after a subsequent press-bonding, the plate member 54 is removed, so that a desired cavity 58 is formed with a high degree of dimensional precision.

This process, however, requires laborious work for punching ceramic sheets and, in addition, a complicated process for performing press-bonding to be conducted prior to firing, resulting in an increased production cost. Another problem is that it is not easy to maintain the required degree of dimensional precision due to influence of undulation encountered in the course of firing.

SUMMARY OF THE INVENTION

In order to overcome the problems described above, preferred embodiments of the present invention provide a process for producing a multilayered ceramic substrate, with which a ceramic substrate having a step portion of a desired shape can be efficiently produced without requiring complicated producing process steps and equipments, and provide also a multilayered ceramic substrate having high form precision produced by the process.

According to a preferred embodiment of the present invention, a process for producing a ceramic substrate includes the steps of: (A) forming an auxiliary-layer-lined unfired ceramic body comprising an unfired ceramic body lined at least one principal surface thereof with an auxiliary layer adhered thereto, the auxiliary layer being made of a material which is substantially unsinterable at a firing temperature of the unfired ceramic body, the auxiliary-layer-lined unfired ceramic body having a step portion formed in at least one principal surface thereof; and (B) subjecting the auxiliary-layer-lined unfired ceramic body having the step portion to firing conducted at a temperature at which the unfired ceramic body is sinterable but the auxiliary layer is substantially unsinterable, while the auxiliary layer remains adhered to the unfired ceramic body without being removed.

It is preferable that a predetermined region of the auxiliary-layer-lined unfired ceramic body is deformed, while the thickness of the unfired ceramic body is maintained substantially constant over the entire area thereof and while the adhesion between the unfired ceramic body and the auxiliary layer is maintained, whereby the step portion is formed on each of the two principal surfaces of the auxiliary-layer-lined unfired ceramic body.

By preferably performing pressing using a die which has a projection and which is arranged to face the side of the auxiliary-layer-lined unfired ceramic body retaining the auxiliary layer, the step portion is formed on the surface of the auxiliary-layer-lined unfired ceramic body retaining the auxiliary layer to have a shape correspond to an external shape of the projection.

The pressing is preferably performed using the die having the projection facing the side of the auxiliary-layer-lined unfired ceramic body retaining the auxiliary layer, by applying a pressure to the auxiliary-layer-lined unfired ceramic body from the side thereof opposite to the side facing the die having the projection, by a hydrostatic pressing method or through an elastic medium.

The die having the projection preferably includes a plate-shaped support member and a projection-forming member which is disposed on the plate-shaped support member and which is made of a material that is substantially unsinterable at the firing temperature of the unfired ceramic body.

The auxiliary-layer-lined unfired ceramic body having the step portion is preferably fired while being kept in engagement with the projection-forming member.

Dies each having the projection are preferably arranged to face a predetermined position on each of the two principal surfaces of the auxiliary-layer-lined unfired ceramic body, whereby step portions having shapes corresponding to the external shapes of the associated dies are formed in both principal surfaces of the auxiliary-layer-lined unfired ceramic body.

The projection of the die preferably has a plurality of steps, so that the step portion is formed in the auxiliary-layer-lined unfired ceramic body to have a shape corresponding to outer shape of the projection having the plurality of the steps.

The die projection is preferably tapered.

At least the projection of the die has a hardness greater than those of the unfired ceramic body and the auxiliary layer constituting the auxiliary-layer-lined unfired ceramic body and also has elasticity.

The projection-forming member preferably is formed through a pressing step in which the material of the die-forming member receives a pressure higher than that applied when forming the auxiliary-layer-lined unfired ceramic body.

A reinforcement material is preferably provided on at least a portion of the regions of the auxiliary-layer-lined unfired ceramic body which are subjected to deformation following the contour of the die projection.

The unfired ceramic body preferably is an unfired ceramic laminate structure formed of a laminate of a plurality of ceramic green sheets, and wherein an inter-layer conductor pattern providing electrical connection between different layers and a planar conductor pattern at an interface between adjacent layers are disposed inside the unfired ceramic laminate structure.

The auxiliary-layer-lined unfired ceramic body having the adhered auxiliary layer is preferably formed by adhering the auxiliary layer to a ceramic green sheet laminate structure prepared by laminating a plurality of ceramic green sheets and press-bonding these sheets in a lump.

The auxiliary-layer-lined unfired ceramic body having the adhered auxiliary layer preferably is formed by adhering the auxiliary layer to a ceramic green sheet laminate structure prepared by a sequential press-bonding laminating method in which a plurality of ceramic green sheets are laminated while pressure bonding is performed upon stacking of each or a predetermined number of successive sheets.

The auxiliary-layer-lined unfired ceramic body with the adhered auxiliary layer has a recess formed at a portion to be contacted by the projection of the die, the height H of the projection being greater than the depth D of the recess.

The unfired ceramic body preferably is a mother board for producing a plurality of substrates, and wherein the process includes the step of dividing the mother board after the firing step into individual ceramic substrates.

The process for forming the ceramic substrate also preferably includes the step of mounting a surface mount device on the ceramic substrate after the firing.

According to another preferred embodiment of the present invention, a ceramic substrate which is produced by the process described above has a step portion provided on at least one principal surface thereof.

According to a preferred embodiment of the present invention, a process for producing a ceramic substrate includes the steps of: (A) forming an auxiliary-layer-lined unfired ceramic body comprising an unfired ceramic body lined at least one principal surface thereof with an auxiliary layer adhered thereto, the auxiliary layer being made of a material which is substantially unsinterable at a firing temperature of the unfired ceramic body, the auxiliary-layer-lined unfired ceramic body having a step portion formed in at least one principal surface thereof; and (B) subjecting the auxiliary-layer-lined unfired ceramic body having the step portion to firing conducted at a temperature at which the unfired ceramic body is sinterable but the auxiliary layer is substantially unsinterable, while the auxiliary layer remains adhered to the unfired ceramic body without being removed. It is therefore possible to efficiently produce a ceramic substrate having a step portion of a desired shape without requiring complicated process steps and equipment.

More specifically, in this process, an auxiliary-layer-lined unfired ceramic body is formed to have an unfired ceramic body lined at least one principal surface thereof with an auxiliary layer adhered thereto, the auxiliary layer being made of a material which is substantially unsinterable at a firing temperature of the unfired ceramic body, the auxiliary-layer-lined unfired ceramic body having a step portion formed in at least one principal surface thereof. (By way of example, an auxiliary-layer-lined unfired ceramic body having a step portion can be formed by adhering an auxiliary layer to an unfired ceramic body formed by laminating and press-bonding a plurality of ceramic green sheets, followed by deformation by pressing using a die, or by a sequential press-bonding method in which auxiliary layer green sheets and ceramic green sheets are laminated one by one on a die, followed by press bonding upon lamination of each or a plurality of green sheets). This process step makes it possible to prepare an unfired ceramic body having a desired step portion, while suppressing or eliminating breakage and rupture of the unfired ceramic body and internal electrode pattern provided therein.

In this process, the auxiliary-layer-lined unfired ceramic body having the step portion is subjected to firing conducted at a temperature at which the unfired ceramic body is sinterable but the auxiliary layer is substantially unsinterable, while the auxiliary layer remains adhered to the unfired ceramic body without being removed. The auxiliary layer produces a force (constraining force), which restrains the ceramic body from contracting or deforming during sintering. Therefore, the firing can be conducted while suppressing or eliminating contraction and deformation of the ceramic body, whereby a ceramic substrate having high shape stability is obtained maintaining the step shape of the unfired ceramic body.

It is also to be noted that the auxiliary layer provided on the surface of the unfired ceramic body offers an advantageous effect in that, although a surface crack may be generated in the auxiliary layer of the auxiliary-layer-lined unfired ceramic body during bending, such a surface crack does not produce any undesirable effect on the unfired ceramic body, so that the ceramic substrate can be produced having the desired properties.

A predetermined region of the auxiliary-layer-lined unfired ceramic body is preferably deformed, while the thickness of the unfired ceramic body is maintained substantially constant over the entire area thereof and while the adhesion between the unfired ceramic body and the auxiliary layer is maintained, whereby the step portion is formed on each of the two principal surfaces of the auxiliary-layer-lined unfired ceramic body. With this process, it possible to prepare an unfired ceramic body having a desired step portion, while more reliably suppressing or eliminating breakage and rupture of the unfired ceramic body and internal electrode pattern provided therein.

Pressing is preferably performed using a die which has a projection and which is arranged to face the side of the auxiliary-layer-lined unfired ceramic body retaining the auxiliary layer, so that the step portion is formed on the surface of the auxiliary-layer-lined unfired ceramic body retaining the auxiliary layer to have a shape correspond to an external shape of the projection. In this process, the projection of the die acts on the unfired ceramic body indirectly through the intermediary of the auxiliary layer. It is therefore possible to prepare an unfired ceramic body having a desired step portion, while suppressing or eliminating breakage and rupture of the unfired ceramic body and internal electrode pattern provided therein, even when the projection has a sharp contour to some extent.

The auxiliary layer provided on the surface of the unfired ceramic body offers an advantageous effect in that, although a surface crack may be generated in the portion of the auxiliary layer contacted by the die projection during the bending, such a surface crack does not produce any undesirable effect on the unfired ceramic body, so that the ceramic substrate can be produced having the desired properties.

The die projection closely engages with the step portion of the unfired ceramic body after the pressing. The constraining force exerted on the unfired ceramic body by the auxiliary layer is maintained despite any surface cracking of the auxiliary layer which may be generated during the pressing, because the firing is conducted while keeping the die projection in engagement with the step portion.

The pressing is preferably performed using the die having the projection facing the side of the auxiliary-layer-lined unfired ceramic body retaining the auxiliary layer, by applying a pressure to the auxiliary-layer-lined unfired ceramic body from the side thereof opposite to the side facing the die having the projection, by a hydrostatic pressing method or through an elastic medium. In this process, the pressing operation is performed such that, while the die projection acts on the unfired ceramic body indirectly through the intermediary of the auxiliary layer and, pressure is uniformly applied to the auxiliary-layer-lined unfired ceramic body from the side thereof opposite to the side facing the die. It is therefore possible to prepare an unfired ceramic body having a desired step portion, while suppressing or eliminating breakage and rupture of the unfired ceramic body and internal electrode pattern provided therein, even when the projection has a sharp contour to some extent.

The auxiliary layer provided on the surface of the unfired ceramic body offers an advantageous effect in that, although a surface crack may be generated in the portion of the auxiliary layer contacted by the die projection during the bending, such a surface crack does not produce any undesirable effect on the unfired ceramic body.

The die having the projection preferably includes a plate-shaped support member and a projection-forming member which is disposed on the plate-shaped support member and which is made of a material that is substantially unsinterable at the firing temperature of the unfired ceramic body. In this process, the projection-forming member is allowed to be integrated with the auxiliary-layer-lined unfired ceramic body, thus providing a flat shape of the surface (shape of the surface including the projection-forming member of the die) of the auxiliary-layer-lined unfired ceramic body contacted by the die after the pressing. It is possible to achieve higher shape stability even after the pressing, not to mention the shape stability during the pressing.

The auxiliary-layer-lined unfired ceramic body having the step portion is preferably fired while being kept in engagement with the projection-forming member. In this process, the firing can be performed in such a state that the surface (shape of the surface including the projection-forming member of the die) of the auxiliary-layer-lined unfired ceramic body contacted by the die after the pressing is maintained flat, that is, in a state which affords high shape stability and high resistance to deformation. It is therefore possible to obtain a ceramic substrate which excels both in dimensional precision and shape accuracy.

Dies each having the projection are preferably arranged to face a predetermined position on each of the two principal surfaces of the auxiliary-layer-lined unfired ceramic body, whereby step portions having shapes corresponding to the external shapes of the associated dies are formed in both principal surfaces of the auxiliary-layer-lined unfired ceramic body. With this process, it is possible to securely form sharp step portions on both sides of the product, corresponding to the contours of the die projections, thus enhancing the advantageous effects of various preferred embodiments of the present invention.

The projection of the die preferably has a plurality of steps, so that the step portion is formed in the auxiliary-layer-lined unfired ceramic body to have a shape corresponding to an outer shape of the projection having the plurality of the steps. This process offers a greater versatility in the shape of the step portions, thus making it possible to efficiently produce ceramic substrates having various shapes of step portions adapting to a wide use.

A tapered die projection is preferably used in the ceramic substrate production process. The use of a die having a tapered die projection makes it possible to reduce a deformation angle at the step portion, as compared to the case where a die has a projection of another shapes, e.g., a quadratic prism or a cylindrical shape. This enables production of an unfired ceramic body having a step portion of a desired depth, while suppressing or eliminating breakage and rupture of the unfired ceramic body and internal electrode pattern provided therein, even when the depth of the step portion is large.

It is to be understood that the allowance for the increased depth of the step portion affords a greater versatility in the dimensions of the step portion.

At least the projection of the die preferably has a hardness that is greater than those of the unfired ceramic body and the auxiliary layer constituting the auxiliary-layer-lined unfired ceramic body and also has elasticity. This ensures that a step portion having a shape corresponding to the shape of the die projection is formed in the unfired ceramic body, thus enhancing the advantageous effects of various preferred embodiments of the present invention.

By way of example, the following method can be used for forming a die projection which has hardness greater than those of the unfired ceramic body and the auxiliary layer constituting the auxiliary-layer-lined unfired ceramic body and which also has elasticity. A green sheet (auxiliary layer green sheet) is formed by compounding a powder used as the material of the auxiliary layer (other type of powder also may be used) with a binder and forming the compound into a sheet. Then, the green sheet is punched to form a green sheet (die-forming green sheet) in which only the portions to form the projection are left unremoved. A plurality of such die-forming green sheets are then stacked and press-bonded under a load of a level which is the same as the load applied when forming the auxiliary-layer-lined unfired ceramic body by laminating and press-bonding substrate forming green sheets and auxiliary layer green sheets. The die-forming green sheets have vacant areas which have been punched out. The pressure received by a unit area is therefore greater when the die-forming green sheets are press-bonded, as compared to the pressure applied to the same unit area in the press-bonding of the substrate forming green sheets and auxiliary layer green sheets, even though the level of the pressing load is equal. It is thus possible to form a die having a projection which has hardness greater than those of the unfired ceramic body and the auxiliary layer constituting the auxiliary-layer-lined unfired ceramic body and which also has elasticity.

When the press-bonding is conducted while the material is still powdery, i.e., unless the material is shaped into green sheets, it is generally difficult to form a projection which has hardness greater than those of the unfired ceramic body and the auxiliary layer constituting the auxiliary-layer-lined unfired ceramic body and which also has elasticity.

The projection-forming member is preferably formed through a pressing step in which the material of the die-forming member receives a pressure higher than that applied when forming the auxiliary-layer-lined unfired ceramic body. In this case, it is possible to more reliably form a projection-forming member which has hardness greater than those of the unfired ceramic body and the auxiliary layer constituting the auxiliary-layer-lined unfired ceramic body and which also has elasticity, as explained above, whereby the advantageous effects of various preferred embodiments of the present invention are further enhanced.

A reinforcement material is preferably provided on at least a portion of the regions of the auxiliary-layer-lined unfired ceramic body which are subjected to deformation following the contour of the die projection. This process effectively suppresses and prevents generation of defects such as cracks in the auxiliary-layer-lined unfired ceramic body, making it possible to produce reliable ceramic substrates at a high yield.

The risk of generation of deep cracks in the surface of the auxiliary-layer-lined unfired ceramic body is increased, when the latter is largely deformed to present a large depth of the step portion. The risk of generating such defects can effectively be avoided when a reinforcement material (e.g., glass paste or conductive paste) that is resistant to deformation and cracking is beforehand applied to the portions which are susceptible to cracking (portions which undergo large bending).

The reinforcement material may be one which remains after the firing, such as the glass paste or conductive paste as described, although a resin material which is lost during debinding may also be used. Thus, there is no practical restriction in the selection of this material.

The unfired ceramic body preferably includes a laminate of a plurality of ceramic green sheets (i.e., laminate structure for producing multilayered ceramic substrate). An inter-layer conductor pattern providing electrical connection between different layers and a planar conductor pattern at an interface between adjacent layers are disposed inside the laminate structure. The ceramic substrate production process according to various preferred embodiments of the present invention can be applied also to the production of this type of structure, making it possible to prepare an unfired ceramic body having a desired step portion, while suppressing or eliminating breakage and rupture of the unfired ceramic body and internal electrode pattern provided therein. In addition, the auxiliary-layer-lined unfired ceramic body having the step portion is subjected to firing conducted at a temperature at which the unfired ceramic body is sinterable but the auxiliary layer is substantially unsinterable, while the auxiliary layer remains adhered to the unfired ceramic body without being removed. This effectively suppresses or prevents any contraction and deformation in the course of the firing, thus allowing efficient production of a multilayered ceramic substrate having high form precision and contributing to further enhancement of the advantageous effects of various preferred embodiments of the present invention.

The auxiliary-layer-lined unfired ceramic body having the adhered auxiliary layer is preferably formed by adhering the auxiliary layer to a ceramic green sheet laminate structure prepared by laminating a plurality of ceramic green sheets and press-bonding these sheets in a lump. Thus, a preferred embodiment of the present invention can suitably be used in the production of multilayered ceramic substrates by a lump press-bonding method, thereby enabling efficient production of multilayered ceramic substrates having desired properties.

The auxiliary-layer-lined unfired ceramic body having the adhered auxiliary layer is formed by adhering the auxiliary layer to a ceramic green sheet laminate structure prepared by a sequential press-bonding laminating method in which a plurality of ceramic green sheets are laminated while press-bonding is performed upon stacking of each or a predetermined number of successive sheets. Thus, a preferred embodiment of the present invention also can suitably be used in the production of multilayered ceramic substrates by the sequential press-bonding method, thereby enabling efficient production of multilayered ceramic substrates having desired properties.

The auxiliary-layer-lined unfired ceramic body with the adhered auxiliary layer preferably has a recess formed at a portion to be contacted by the projection of the die, the height H of the projection being greater than the depth D of the recess. With this process, it is possible to efficiently produce ceramic substrates having deep step portions, or ceramic substrates having step portions of different depths on both sides thereof, while effectively suppressing and preventing generation of breakage or rupture of the unfired ceramic body and of internal electrode patterns provided therein.

The unfired ceramic body preferably is a mother board for producing a plurality of substrates, and the process includes the step of dividing the mother board after the firing step into individual ceramic substrates (thus, multiple formation method is used). This makes it possible to efficiently produce a large number of substrates by dividing the mother board, contributing to reduction in the production cost.

The process of producing the ceramic substrate preferably includes the step of mounting a surface mount device on the ceramic substrate after the firing. This process permits efficient production of compact and highly reliable ceramic substrates having a high packaging density of surface mount components on the step portions.

A ceramic substrate produced by a process described above has a step portion provided on at least one principal surface thereof. The step portion is formed with high degrees of shape and dimensional precisions, thus exhibiting superior reliability. The ceramic substrate therefore finds a variety of uses.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 11A shows a modification of a preferred embodiment of the ceramic substrate production process of the present invention, while

FIG. 24A is a perspective view of the ceramic substrate shown in FIG. 23, showing the configuration of the ceramic substrate as viewed from the upper side, while

DETAILED DESCRIPTION OF THE PREFERRED EMBODIMENTS

Figure 1:
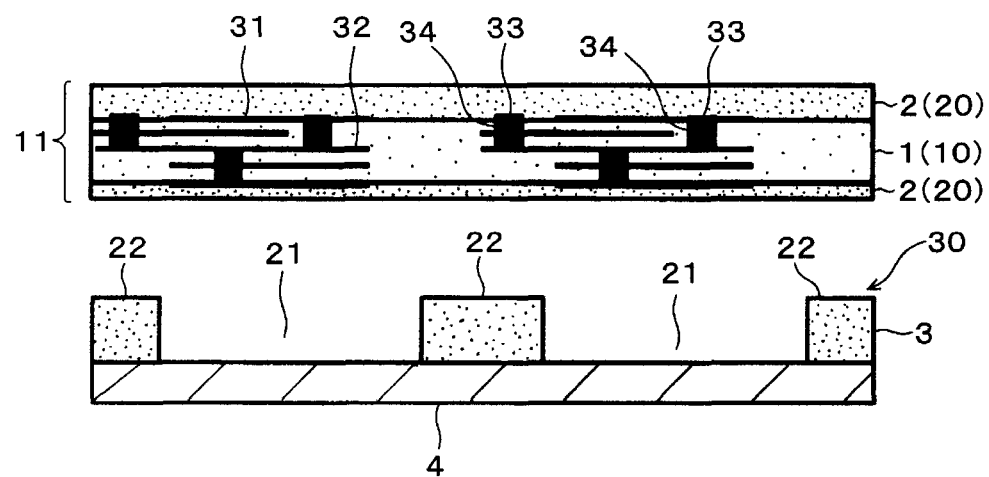
FIG. 1 shows a laminate structure (auxiliary-layer-lined unfired ceramic body) prepared in accordance with a first preferred embodiment of the present invention, together with a deformation die.

Hereinafter, features of the present invention will be described in more detail, through illustration of various preferred embodiments of the present invention.

First Preferred Embodiment

A description will be given of a first preferred embodiment of a ceramic substrate production process of the present invention.

(1) First, ceramic green sheets (hereinafter referred to as "substrate green sheets") containing a ceramic material used for forming a ceramic substrate are prepared. An example of the procedure is as follows.

A mixture containing about 5% to about 20% by weight of $B_2O_3$ with respect to a sub-mixture composed of about 10% to about 55% percent by weight of CaO, about 45% to about 70% by weight of $SiO_2$, about 0% to about 30% percent by weight of $Al_2O_3$ and about 0% to about 10% percent by weight of impurities is vitrified by melting at approximately 1,450° C. and is then quenched in water, followed by pulverization, so that a powdered $CaO\text{---}SiO_2\text{---}Al_2O_3\text{---}B_2O_3$-based glass having an average grain size of about 3.0 µm to about 3.5 µm is formed.

In this first preferred embodiment, although $CaO\text{---}SiO_2\text{---}Al_2O_3\text{---}B_2O_3$-based glass was preferably used, other types of glass sinterable at a temperature of approximately 800° C. to approximately 1,000° C. may be used.

A ceramic powder is then formed by mixing about 50% to about 65% by weight (preferably about 60% by weight) of this glass powder and about 50% to about 35% by weight (preferably about 40% by weight) of an alumina powder containing about 0% to about 10% by weight of impurities. Subsequently, a solvent (such as toluene, xylene, or a water-based solvent), a binder (such as an acrylic or a butyral resin), and a plasticizer (such as dioctylphthalate (DOP) or dibutylphthalate (DBP)) are added to this ceramic powder, followed by sufficient kneading and dispersing, so that a slurry having a viscosity of about 2,000 cps to about 40,000 cps is formed. Next, by using a common casting method (such as a doctor blade method), a green sheet (substrate green sheet forming a major portion of a ceramic substrate used as a product) is formed to have a thickness of, for example, from about 0.01 mm to about 0.4 mm.

The formation of the substrate green sheet may be conducted by suitably adjusting the composition ratios and additives so that the substrate green sheet is appropriately softer than a later-mentioned auxiliary layer (constraining layer) green sheet. This will contribute to improvement in the property of the ceramic green sheet to follow the shape of a later-mentioned die 30 in a forming step which will be conducted later, thus achieving high precision, while suppressing or preventing occurrence of defects such as cracking and chipping of the ceramic green sheet.

(2) Subsequently, the substrate green sheet 1 (in FIG. 1) formed in the above-described step (1) is cut using a punching die or a punching machine to have predetermined dimensions, and interlayer connection via holes 33 (FIG. 1) are also formed.

(3) Next, a conductor paste is charged to fill up the via holes 33 in the substrate green sheets which have been machined through the above-described step (2), so that via hole conductors 34 are formed. Furthermore, predetermined wire patterns are formed to serve as an external conductor 31, internal layer conductors 32, and so on, by printing the conductive paste on the substrate green sheets 1.

The conductive paste used in this case may be a paste containing powdered Ag, Ag—Pd, Ag—Pt, or Cu as the conductive component. Together with or instead of the conductive paste, a resistive paste or a glass paste may be printed when necessary.

(4) Then, an operation is conducted to form a plurality of auxiliary (constraining) layer green sheets 2 (FIG. 1) containing ceramics which are substantially unsinterable at the firing temperature of the substrate green sheet 1.

The auxiliary layer green sheets (constraining layer green sheets) 2 can be obtained, for example, by the steps of preparing slurry formed of an organic vehicle and alumina powder dispersed therein, and forming sheets from the slurry using a casting method. Since having a sintering temperature of approximately 1,500° C. to approximately 1,600° C., the auxiliary layer green sheets (constraining layer green sheets) 2 thus obtained are not sintered at the sintering temperature of the substrate green sheet 1 (e.g., approximately 800° C. to approximately 1,000° C.). The substrate green sheets 1 are sintered together with the auxiliary (constraining) layer green sheets 2 bonded thereto. Therefore, the sintering operation can be performed while suppressing two-dimensional contraction of the substrate green sheets 1.

In order that an unfired ceramic body 10 is pressed without being damaged, the properties of the auxiliary (constraining) layer green sheets 2 are adjusted to provide hardness greater than that of the substrate green sheets 1.

(5) A green sheet (die-forming green sheet) 3 (FIG. 1), which is obtained by punching from the auxiliary (constraining) layer green sheet 2 formed in the above-described step (4) to have a predetermined shape and which is used to form a die, is press-bonded to a fixing surface (flat plate) 4 (FIG. 1) at a high pressure, whereby a pressing (deforming) die 30 (FIG. 1) is formed.

In the die-forming green sheet 3, a portion which is removed by punching out provides a recess (die) 21 of the pressing die 30, while the remaining portion which is not punched out provides a projection forming member, and this projection forming member is press-bonded to the fixing surface (plate) 4, thereby forming a projection (die) 22 of the die 30. The projection 22 of the die 30 has been formed from a portion of the green sheet and, hence, has a certain degree of elasticity. Therefore, a step portion 15 (FIGS. 2 and 3) having a desired shape can be formed while a laminate structure (auxiliary-layer-lined unfired ceramic body) 11 is prevented from being damaged.

As the plate 4 used to form the die 30, a material (a resin or a metal) having an appropriate hardness is preferably used. The plate also may be formed from a composite material composed of plural types of materials.

(6) Subsequently, as shown in FIG. 1, the auxiliary (constraining) layer green sheets 2 are laminated on each of the two principal surfaces (top and bottom) of a substrate green sheet laminate structure (unfired ceramic body) 10 which is formed by laminating a plurality of the green sheets 1, thereby forming auxiliary layers 20, whereby a laminate structure (auxiliary-layer-lined unfired ceramic body) 11 (FIG. 1) is obtained. In the first preferred embodiment, the thickness of the auxiliary sheet on the bottom of the laminate structure is preferably smaller than that of the auxiliary sheet on the top of the laminate structure.

Figure 2:
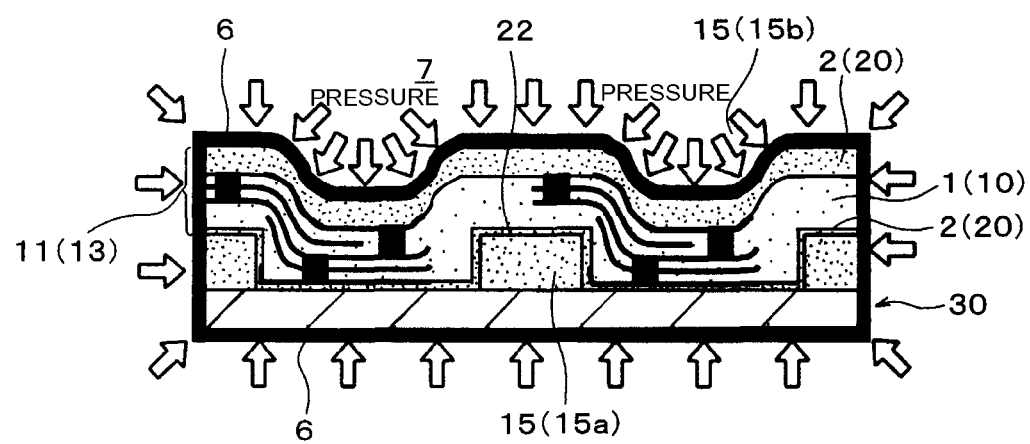
FIG. 2 shows the laminate structure (auxiliary-layer-lined unfired ceramic body) undergoing hydrostatic pressing operation performed by using the die in accordance with the first preferred embodiment of the present invention.

(7) Referring now to FIG. 2, the pressing (deforming) die 30 is adhered to the auxiliary-layer-lined unfired ceramic body 11 and is then put in a vacuum package formed by using a flexible film 6. Pressing is then performed by a hydrostatic pressing method so as to isotropically apply, through the intermediary of water 7, a pressure on the principal surface of the auxiliary-layer-lined unfired ceramic body 11 which is not in contact with the die 30, whereby the auxiliary-layer-lined unfired ceramic body 11 is obtained.

Figure 3:
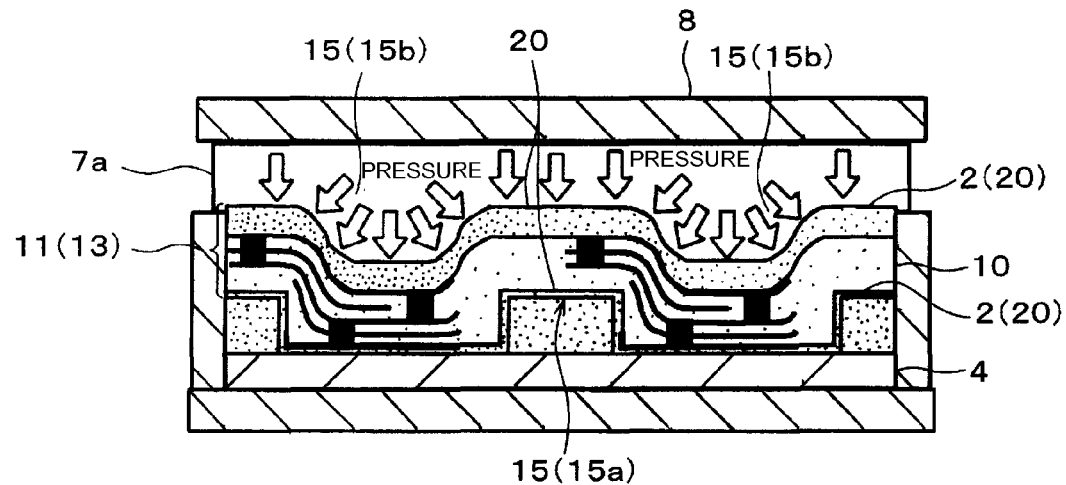
FIG. 3 shows a modification of the pressing operation for pressing the laminate structure (auxiliary-layer-lined unfired ceramic body) prepared in accordance with the first preferred embodiment of the ceramic substrate production process of the present invention.

As the pressing method, instead of the hydrostatic pressing method, a method as shown in FIG. 3 may also be used in which pressing is performed by using a plate-shaped press bonding die 8 via an elastic member 7a (such as a silicon rubber) to deform the auxiliary-layer-lined unfired ceramic body 11, i.e., to form the step portion 15.

In this pressing step, since water 7 or the elastic member 7a is deformed to follow the concave and convex shape of the principal surface of the auxiliary-layer-lined unfired ceramic body 11 which is not in contact with the die 30, the auxiliary-layer-lined unfired ceramic body 11 is smoothly deformed by the pressure transmitted through the water 7 or the elastic member 7a. As a consequence, the portion of the auxiliary-layer-lined unfired ceramic body 11 adjacent to the die 30 is caused to enter and follow the recesses 21 of the die 30 to reach the upper surface of the plate 4.

It is thus possible to sufficiently deform the auxiliary-layer-lined unfired ceramic body 11 to obtain the step portions 15 (15a) of an intended shape.

The pressing of the auxiliary-layer-lined unfired ceramic body 11 using the die 30 is preformed at a pressing pressure of about 100 kg/cm$^2$ to about 2,000 kg/cm$^2$, preferably about 1,000 kg/cm$^2$ to about 2,000 kg/cm$^2$, and at a temperature of about 30° C. to about 100° C., and more preferably about 50° C. to about 80° C.

In this case, the die-forming green sheet (punched auxiliary (constraining) layer green sheet) 3, which forms the pressing die 30, has been press-bonded to the plate 4 at a high pressure. The die-forming green sheet 3 therefore exhibits hardness high enough to deform the auxiliary-layer-lined unfired ceramic body 11, while showing some degrees of elasticity as described before.

It is also to be noted that, since the substrate green sheets 1 forming the major portion of the auxiliary-layer-lined unfired ceramic body 11 is soft as compared to the die-forming green sheets 3 forming the pressing die 30, the unfired ceramic body 10 can easily be deformed without fail.

(8) Next, the plate 4 providing the fixing surface is separated from the deformed composite press-bonded member 13 (auxiliary-layer-lined unfired ceramic body 11, including the die 30). Then, a firing operation is performed at a sintering temperature of the unfired ceramic body 10, for example, at a temperature of about 1,000° C. or less, preferably about 800° C. to about 1,000° C., while the auxiliary layers 20 and the projections 22 remain without being removed, so that a sintered substrate (ceramic substrate) 14 with the auxiliary layers 20 on the two principal surfaces thereof is obtained.

When a conductive paste containing a base metal powder, e.g., powdered Cu, serving as a conductive component is used, the firing operation should be performed in a reducing atmosphere in order to prevent oxidation. In contrast, when a conductive paste containing noble metal powder, e.g., Ag, Ag—Pd, Ag—Pt or the like, serving as a conductive component is used, firing may be performed in the atmospheric air.

(9) Subsequently, the non-sintered auxiliary layers 20 are removed from the surfaces of the sintered substrate (ceramic substrate) 14, the sintered substrate (ceramic substrate) 14 is obtained which has the step portions (recesses) 15 (15a and 15b) in the obverse and reverse principal surfaces.

The removal of the auxiliary layers 20 may be effected by a physical method such as an ultrasonic wave cleaning or an alumina grain blasting, or by a chemical method such as etching. It is also possible to use both a physical method and a chemical method in combination.

Figure 4:
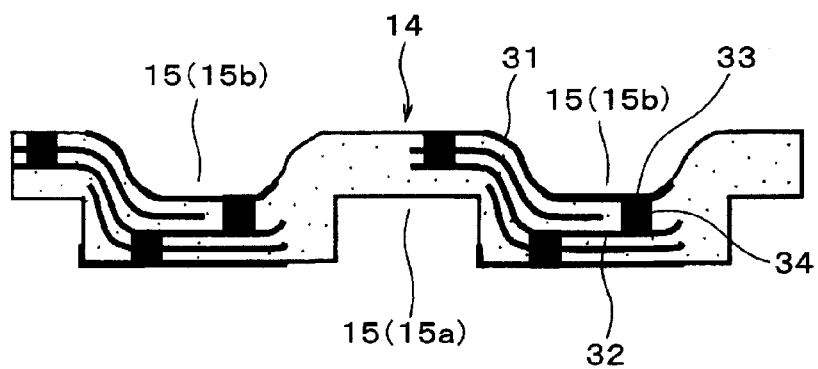
FIG. 4 is an illustration of a sintered substrate (ceramic substrate) having step portions (recesses) in both obverse and reverse principal surfaces, produced in accordance with the first preferred embodiment of the ceramic substrate production process of the present invention.

The sintered substrate (ceramic substrate) 14 formed as described above has the structure in which step portions (portions having concave and convex portions) are formed in two principal surfaces (the upper and the lower surfaces in FIG. 4). In addition, in the surface which was held in contact with the die 30, a side wall of the step portion (recess) 15 (15a) is almost vertical so as to form a sharp recess, and in addition, the surface roughness thereof is small to provide smooth surfaces of the recess. In contrast, in the surface of the sintered substrate (ceramic substrate) 14 which was held away from the die 30, the step portion (recess) 15 (15b) is gently shaped, presenting smooth surface with small surface roughness.

As described, the surface of the auxiliary-layer-lined unfired ceramic body 11, which is opposite to the surface in contact with the die 30, is gently deformed. Therefore, generation of excessive stress is prevented in the portion of the auxiliary-layer-lined unfired ceramic body 11 contacted by the die 30, despite the fact that the step portion (recess) 15 (15a) is formed to have almost vertical side walls and, hence, sharp configuration. It is therefore possible to form the step portion 15 (15a, 15b) of the intended shape, without causing breakage of the unfired ceramic body 10.

As shown in FIGS. 5A, 5B, 5C and 5D, the sintered substrate (ceramic substrate) 14 thus formed can have four types of variations in terms of the shape and orientation of the step portions (recesses) 15, depending on the position of dividing and depending on which of the two principal surfaces is to be used as the mounting surface.

Figure 5A:
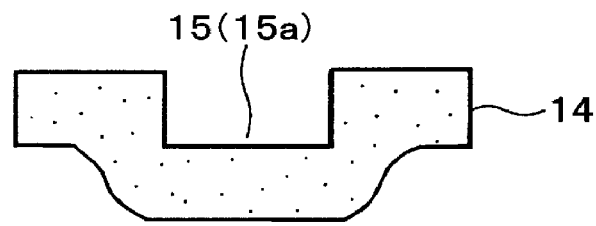
FIGS. 5A, 5B, 5C and 5D show variations of the configuration of the ceramic substrate produced in accordance with the first preferred embodiment of the ceramic substrate production process of the present invention.
Figure 5B:
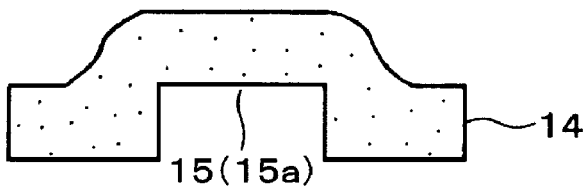
Figure 5C:
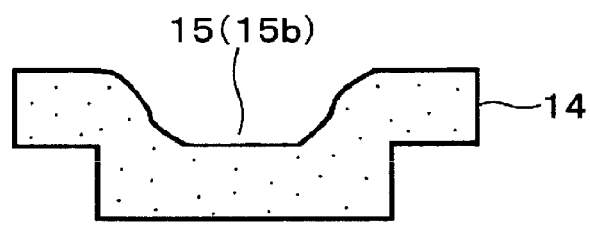
Figure 5D:
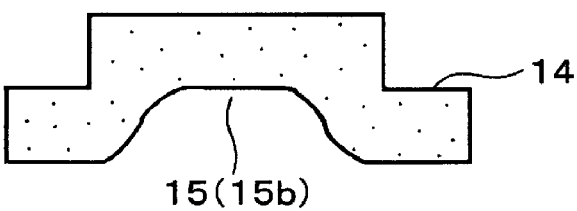

More specifically, as shown in FIGS. 5A and 5B, the ceramic substrate 14 may be formed to have the sharply-shaped recess 15 (15a) with the almost vertical side surface in the obverse side (FIG. 5A) or the reverse side (FIG. 5B) of the ceramic substrate 14. Likewise, as shown in FIGS. 5C and 5D, the ceramic substrate 14 may be formed to have the gently shaped recess 15 (15b) in the obverse side (FIG. 5C) or in the reverse side (FIG. 5D) of the ceramic substrate 14.

Obviously a single sintered substrate 14 (ceramic substrate) may have a plurality of recesses (cavities) 15, although the foregoing description referring to FIGS. 5A to 5D was focused on one recess (cavity) 15.

Figure 6A:
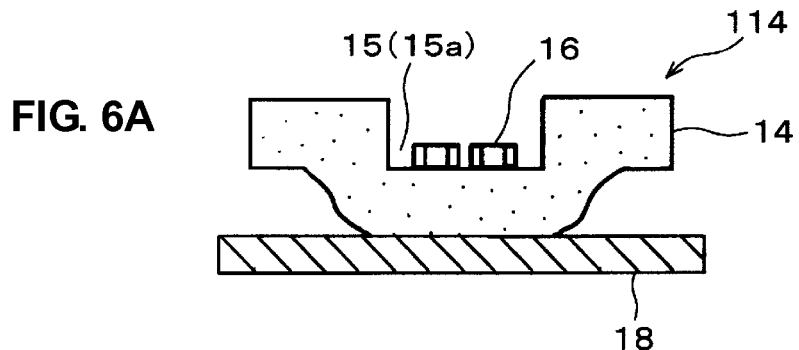
FIGS. 6A, 6B, 6C and 6D show various manners of use of a ceramic substrate produced in accordance with the first preferred embodiment of the ceramic substrate production process of the present invention.
Figure 6B:
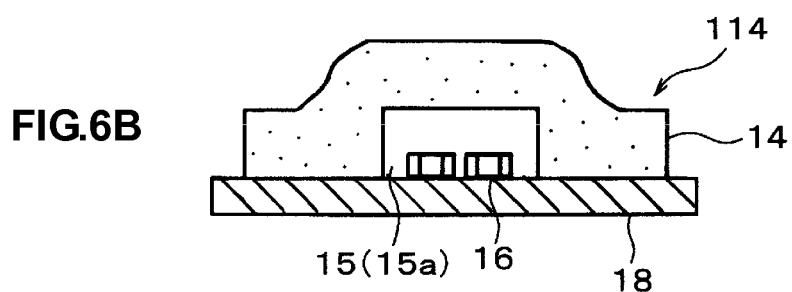

Reference is now made to FIG. 6A in which the ceramic substrate 14 is disposed such that that the sharply-shaped recess 15 (15a) having almost vertical side surfaces faces upward to mount therein electronic devices 16 such as a chip capacitor, a chip inductor, and/or a semiconductor device. FIG. 6B shows an arrangement in which electronic devices 16 are mounted on a mother board 18, and the ceramic substrate 14 is placed thereon so that the sharply-shaped recess 15 (15a) with almost vertical side surfaces facing downward, thereby protecting the electronic devices 16.

Figure 6C:
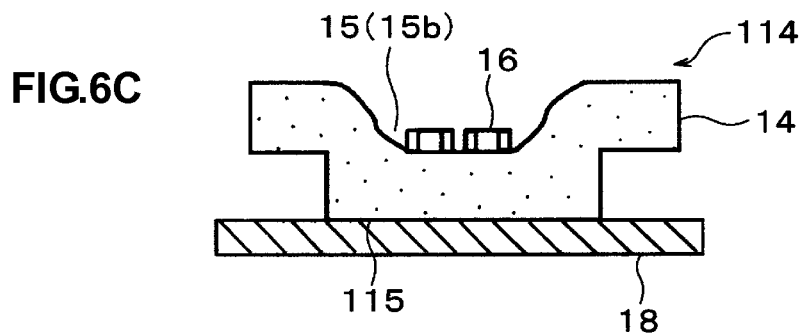
Figure 6D:
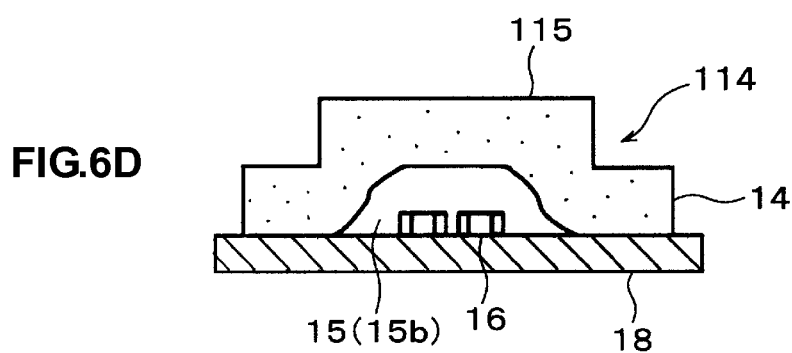

FIG. 6C shows an arrangement in which the ceramic substrate 14 is disposed such that a recess 15 (15b) with gently tapered side walls faces upward to receive therein the electronic devices 16, while FIG. 6D shows an arrangement in which the ceramic substrate 14 is disposed such that electronic devices 16 mounted on a mother board 18 are covered and protected by a downwardly facing recess 15 (15b) having gently tapered side walls.

Figure 7:
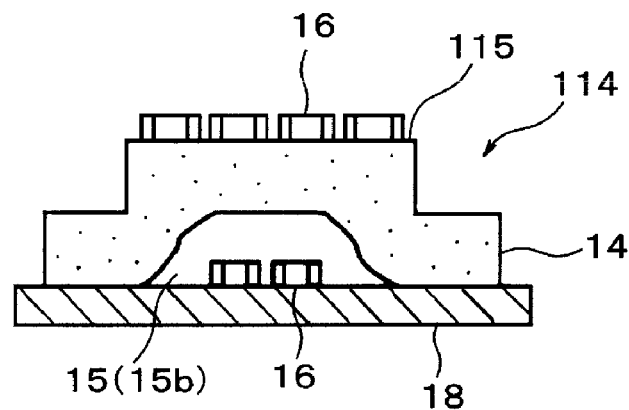
FIG. 7 shows an example of a module substrate produced by mounting a lot of electronic components on a ceramic substrate produced in accordance with the first preferred embodiment of the ceramic substrate production process of the present invention.

The arrangement shown in FIG. 6D, among those shown in FIGS. 6A, 6B, 6C, and 6D, has the downwardly facing recess 15 (15b) with gently tapered side walls and an upwardly facing sharply-shaped projection 115 with a flat top surface of a substantial area. This arrangement is preferred because a module substrate 114 of a large scale of integration is obtainable by mounting a large number of electronic devices on the ceramic substrate, as will be seen from FIG. 7.

In order that various electronic devices can be mounted on the sintered substrate (ceramic substrate) 14 with high reliability, a plating film is preferably formed on the via hole conductors 34 and the external conductors 31 which are exposed on the surface.

As a material for the plating film, for example, Ni—Au, Ni—Pd—Au, Ni—Sn, or the like is preferably used. As a method for forming the plating film, either electroplating or electroless plating may be used.

Figure 8:
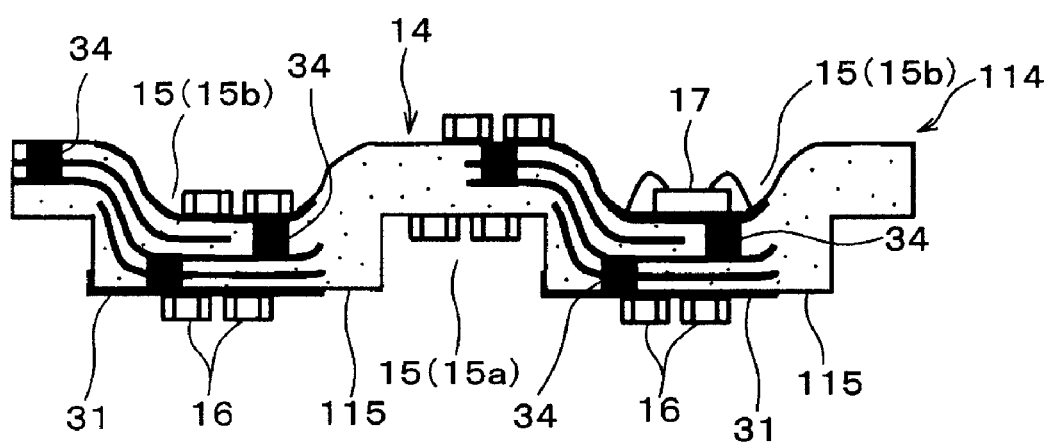
FIG. 8 shows another example of the ceramic substrate (module substrate) which can be produced in accordance with the first preferred embodiment of the ceramic substrate production process of the present invention.

FIG. 8 shows another example of a ceramic substrate which can be produced in accordance with the process of the first preferred embodiment. In this case, the ceramic substrate 14 has a plurality of recesses (cavities) 15 and a plurality of projections 115. Electronic devices 16 and a semiconductor device 17 are mounted on the external conductors 31 and on the via hole conductors 34 which are on the surfaces of the recesses 15 and the projections 115 in the two principal surfaces of the sintered substrate (ceramic substrate) 14 and which are covered by plating films. A module substrate 114 is thus obtained as a product. As described above, according to the process of the first preferred embodiment, a highly integrated module substrate 114 can be obtained having the electronic devices 16 and the semiconductor device 17 efficiently disposed on the two principal surfaces.

In addition, according to the process of the present preferred embodiment for producing a ceramic substrate, a so-called multiple formation system can be used in which after electronic devices are mounted on a sintered substrate (ceramic substrate), resin sealing is performed whenever necessary, and the substrate is divided into individual product units so that a plurality of ceramic substrates are simultaneously obtained. It is thus possible to efficiently produce highly integrated module substrate 114 mounting the electronic devices 16 and the semiconductor device 17 on the two principal surfaces.

As has been described, the first preferred offers the following particular advantages.

(1) The surface of the auxiliary-layer-lined unfired ceramic body 11 opposite to the surface in contact with the die 30 is gently deformed. It is therefore possible to attain the desired shapes of the step portions 15 (15a, 15b) without causing breakage of the unfired ceramic body 10, even in the case where a sharply-shaped step portion (recess) 15 (15a) having an almost vertical side wall is formed in the surface held in contact with the die 30. This owes to suppression of excessive stress to the surface of the unfired ceramic body contacting the die 30.

(2) The projection 22 of the die 30 is formed of the auxiliary (constraining) layer green sheet 2 which is the same as the surface of the laminate structure (auxiliary-layer-lined unfired ceramic body) 11 and, hence, a certain degree of elasticity. Therefore, the laminate structure (auxiliary-layer-lined unfired ceramic body) 11 can be softly worked, and in particular, the laminate structure (auxiliary-layer-lined unfired ceramic body) 11 is prevented from being cracked at a position corresponding to an edge portion of the projection 22.

(3) Cracking in the surface of the laminate structure (auxiliary-layer-lined unfired ceramic body) 11 in the pressing step of the process cannot be completely eliminated even in the first preferred embodiment. Any cracks, however, are confined to only the auxiliary layer (constraining layer) green sheet 2 presenting the surface of the laminate structure (auxiliary-layer-lined unfired ceramic body) 11 without reaching the unfired ceramic body 10 inside the laminate structure, and hence the ceramic substrate 14 having high reliability can be finally obtained.

(4) Surface cracking of the auxiliary layer 20 may occur at a position contacting the projection 22 of the die 30, when the laminate structure (auxiliary-layer-lined unfired ceramic body) 11 is pressed. This, however, does not impair the constraining force during firing, because the cracked surface is tightly contacted by the die 30.

(5) The projection 22 of pressing (deforming) die 30 is formed of the same auxiliary (constraining) layer green sheet 2 as that for the auxiliary layer 20 disposed on the surface of the auxiliary-layer-lined unfired ceramic body 11. The projection therefore can be integrated with the auxiliary-layer-lined unfired ceramic body 11 in the course of the pressing (press-bonding). This makes it possible to flatten one of the principal surfaces of the deformed press-bonded member (auxiliary-layer-lined unfired ceramic body 11, including the die 30) 13. Accordingly, it is possible to reliably hold the laminate structure (auxiliary-layer-lined unfired ceramic body) 11 via the plate 4, thus assuring improved shape stability of the laminate structure (auxiliary-layer-lined unfired ceramic body) 11 during degreasing and firing. A sintered substrate (ceramic substrate) 14 can be reliably produced with high degree of work precision and small dimensional strain.

Second Preferred Embodiment

Figure 9:
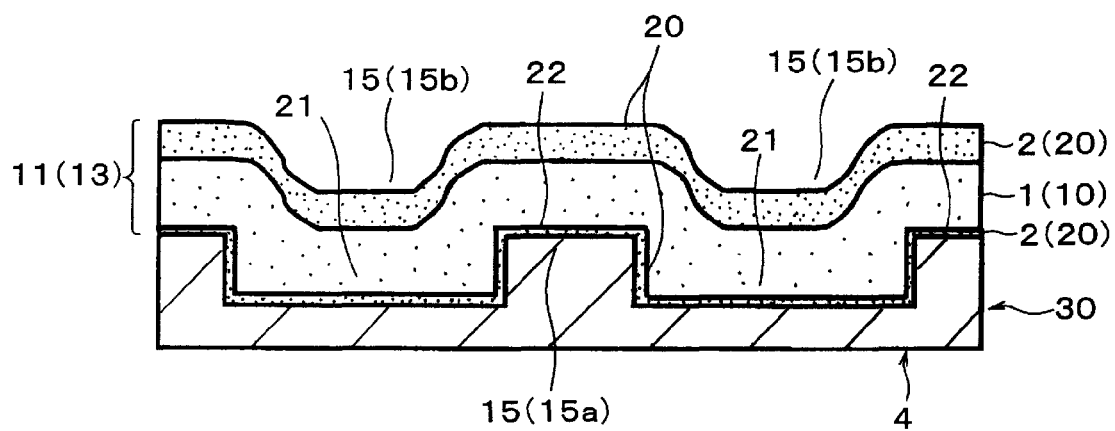
FIG. 9 illustrates a step of a process according to another preferred embodiment of the ceramic substrate production process of the present invention.

FIG. 9 shows one step of a ceramic substrate production process of another preferred embodiment.

In FIG. 9, elements designated by the same reference numerals as those in FIGS. 1 and 2 indicate elements which are the same as or corresponding to those shown therein.

The second preferred embodiment preferably uses, as the pressing (deforming) die, a die 30 which is formed by directly forming recesses 21 and projections 22 having predetermined shapes on a plate 4 made of a material having an appropriate level of hardness (preferably resin in this preferred embodiment). Other features are similar to those of the first preferred embodiment.

The above-mentioned resin-made die is only illustrative, and a die formed by providing recesses and projections in a metal plate may also be used.

By using the die 30 as shown in FIG. 9, as in the case of the above-described first preferred embodiment, a ceramic substrate is produced through a step of forming a press-bonded member 13 having a predetermined shape. This is achieved by pressing a laminate structure (auxiliary-layer-lined unfired ceramic body) 11 composed of a substrate green sheet laminate structure 10 and auxiliary layers 20 on the two surfaces thereof by a hydrostatic pressing method (or a press-bonding using an elastic member).

When the die 30 is used which is formed from a plate (resin plate) 4 composed of a resin material having appropriate hardness and elasticity, as is the case of the second preferred embodiment, the following advantages can be obtained.

(1) The surface of the auxiliary-layer-lined unfired ceramic body 11 opposite to the surface contacting the die 30 can be gently deformed (a smooth recess 15 (15b) is formed in the reverse surface). Accordingly, generation of a large stress in the surface contacting the die 30 is prevented and minimized, despite the formation of a sharply-shaped step portion (recess) 15 (15a) having almost vertical side walls in the surface contacting the die 30. Therefore, the step portions 15 (15a and 15b) having intended shapes can be formed without causing breakage of the unfired ceramic body 10. This advantage corresponds to the advantage (1) achieved in the first preferred embodiment.

(2) The projection 22 of the die 30 is formed of a resin having appropriate levels of hardness and elasticity. Therefore, the laminate structure (auxiliary-layer-lined unfired ceramic body) 11 can be softly worked, and in particular, the laminate structure (auxiliary-layer-lined unfired ceramic body) 11 is prevented from being cracked at a position corresponding to an edge part of the projection 22. This advantage corresponds to a portion of the advantage (2) achieved by the first preferred embodiment. Furthermore, when the laminate structure 11 is deformed by being pressed, the bottom surface of the recess 21 in the die 30, i.e., the plate-shaped member of the die 30, exhibits an elasticity so as to be deformed downward to reduce the risk of damaging of the laminate structure 11 attributable to the deformation.

(3) Any crack which may be generated in the surface of the laminate structure (auxiliary-layer-lined unfired ceramic body) 11 in the course of the pressing is confined to be present only in the auxiliary layer (constraining layer) green sheet 2 presenting the surface of the laminate structure (auxiliary-layer-lined unfired ceramic body) 11, without reaching the unfired ceramic body 10 inside the laminate structure. Therefore, the ceramic substrate 14 having high reliability can be finally obtained. This advantage corresponds to a portion of the advantage (3) achieved by the first preferred embodiment.

(4) In addition, since the die 30 can be repeatedly used, the production cost can be reduced. In addition, when the laminate structure 11 is deformed and press-bonded, the bottom surface is protruded, and as a result, damage caused by the deformation of the laminate structure 11 can be reduced, by virtue of the plate surface which also has elasticity.

It is also possible to use a die 30 made of a plate-shaped member (metal plate) 4 which is hard and which is not elastic. The use of this type of die offers the advantages (1), (3) and (4) out of the foregoing four advantages (1), (2), (3) and (4) attainable when a die 30 made of a resin is used.

In addition, the die 30 made of a metal can sustain repeated use and also exhibits superior workability to form a smooth surface due to hardness of the metal. It is therefore possible to achieve a higher degree of flatness of the machined surface and, hence, higher shaping precision in the forming process.

However, when the metal-made die 30 is used, since the projection 22 is hard and has no elasticity, the above-described advantage (2) achievable with the use of an elastic die cannot be obtained.

When the die 30 made of a metal or a resin is used, it is not possible to fire the laminate structure (auxiliary-layer-lined unfired ceramic body) 11 together with the die 30, since the material for the die 30 has different properties from those of the laminate structure. It is necessary to remove the die 30 from the deformed press-bonded body (auxiliary-layer-lined unfired ceramic body, including the die 30) 13. Hence, firing cannot be performed with the surface adjacent to the die maintained flat. The advantage is therefore not remarkable with regard to the constraining force to be developed during the firing, as compared to the advantage (4) of the first preferred embodiment. Nevertheless, the present preferred embodiment makes it possible to produce ceramic substrate with higher shape and dimensional precision of the known production process, by virtue of the presence of the auxiliary layer (constraining layer) green sheet covering the surface of the laminate structure.

Third Preferred Embodiment

Figure 10:
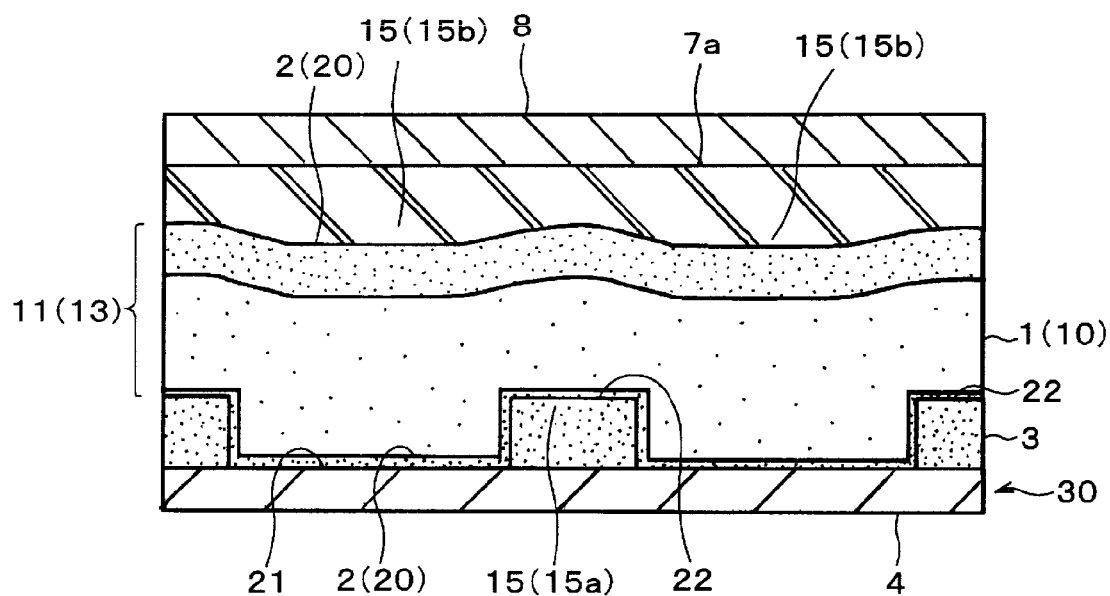
FIG. 10 illustrates a step of a process according to still another preferred embodiment of the ceramic substrate production process of the present invention.

FIG. 10 shows one step of a ceramic substrate production process in accordance with still another preferred embodiment of the present invention.

In FIG. 10, elements designated with the same reference numerals as those in FIGS. 1 and 2 indicate elements which are the same as or corresponding to those shown therein.

In the third preferred embodiment, as is the case of the die 30 of the foregoing first preferred embodiment, a die 30 is used which is formed by adhering to a plate 4 die-forming green sheets 3, which are obtained by punching out sheets which are the same as auxiliary layer (constraining layer) green sheets 2 into a predetermined shape. Onto this die 30, sequentially formed and press-bonded by a so-called sequential press-bonding laminating method are predetermined numbers of auxiliary layer (constraining layer) green sheets 2 that are unsinterable at the sintering temperature of a substrate green sheet, substrate green sheets 1 for forming a ceramic substrate, and constraining layer green sheets 2. As a result, a press-bonded body 13 is formed which includes an unfired ceramic body 10 overlain and underlain by auxiliary layers 20 and having step portions of desired shapes.

More specifically, in the third preferred embodiment, a predetermined number of the auxiliary layer (constraining layer) green sheets 2, a predetermined number of the substrate green sheets 1 used as a ceramic substrate, and a predetermined number of the constraining layer green sheets 2 are stacked one by one. Upon stacking of each green sheet, press-bonding is performed on the surface of the green sheet by using a plate-shaped press-bonding die 8 with an elastic member (such as silicone rubber) 7a interposed therebetween, so that a press-bonded body 13 is formed.

The pressing pressure preferably ranges from about 100 to about 2,000 kg/cm$^2$ and more preferably from about 1,000 to about 2,000 kg/cm$^2$, and the pressing temperature preferably ranges from about 30° C. to about 100° C. and more preferably from about 50° C. to about 80° C.

As is the case of the first preferred embodiment described before, a press-bonded body 13 as shown in FIG. 10 can be obtained in which sharply-shaped step portions (recesses) 15 (15a) having almost vertical side walls are formed in the surface facing the die 30, while step portions (recesses) 15 (15b) having gently tapered side walls are formed in the surface which did not contact the die 30.

The process of the third preferred embodiment for producing a ceramic substrate uses a so-called sequential press-bonding laminating method in which the auxiliary layer (constraining layer) green sheets 2 and the substrate green sheets 1 are laminated in a one by one fashion, and a press-bonding operation is performed on each of the successively stacked green sheets. The elastic member 7a is deformed to follow the convexities and concavities of the die 20 at each press-bonding, so that individual green sheets are sufficiently deformed to enter and fit in the recesses 21 of the die 20, whereby the press-bonded body 13 is formed to have a desired shape.

It is thus possible to reliably produce a ceramic substrate having step portions (concavities and convexities) with superior shape and dimensional precision.

Figure 11A:
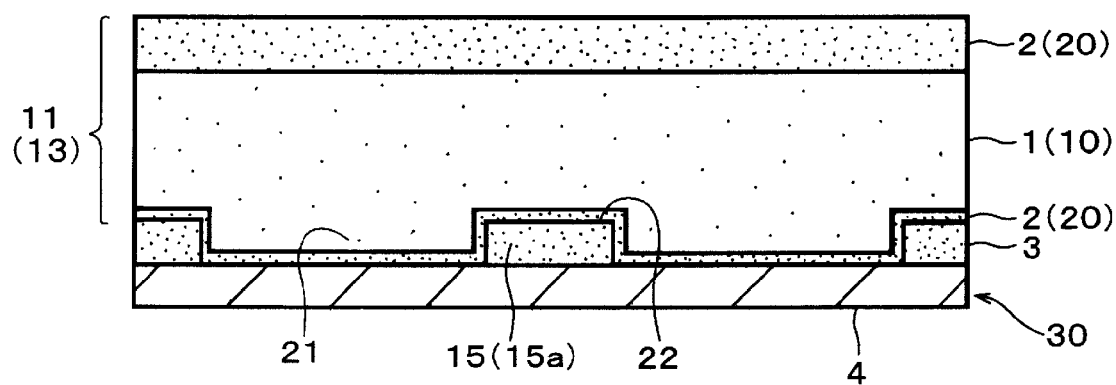

The green sheets are laminated and press-bonded one by one inside the recesses 21 of the deforming die 30. The green sheets are therefore progressively expanded to selectively fill the recesses 21 of the die 30, and as the number of layers laminated (number of press-bonded layers) grows large, the depth of the recesses 15 (15b) formed in the surface opposite to the surface facing the die 30 is progressively decreased. Therefore, when the depth of the recesses 21 on the die 30 is small, the depth of the recesses 15 (15b) formed in the surface opposite to the surface facing the die 30 progressively decreases as the thickness of the unfired ceramic body 10 grows large (the number of lamination layers grows large), and finally, steps at the above-mentioned recesses disappear. It is thus possible to obtain the press-bonded body 13 in which, as shown in FIG. 11A, a sharply-shaped step portion (recess) 15 (15a) having almost vertical side wall surfaces is formed in only one surface while the surface opposite thereto is flat. A ceramic substrate 14 having the step portion (recess) 15 (15a) in only one surface can be produced by firing this press-bonded body 13.

Figure 11B:
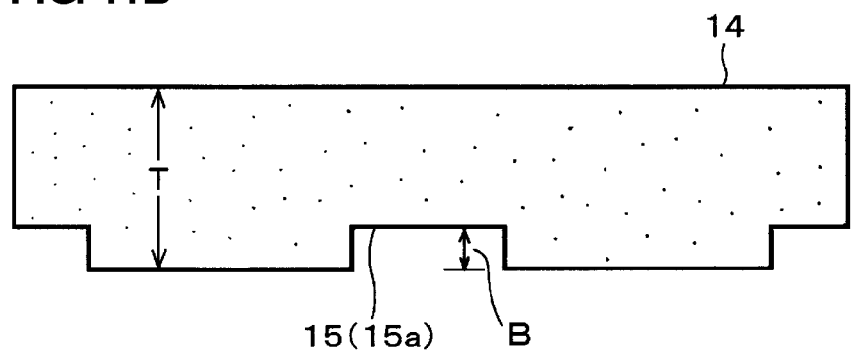
FIG. 11B is an illustration of a ceramic substrate produced by the process shown in FIG. 11A.
Figure 12:
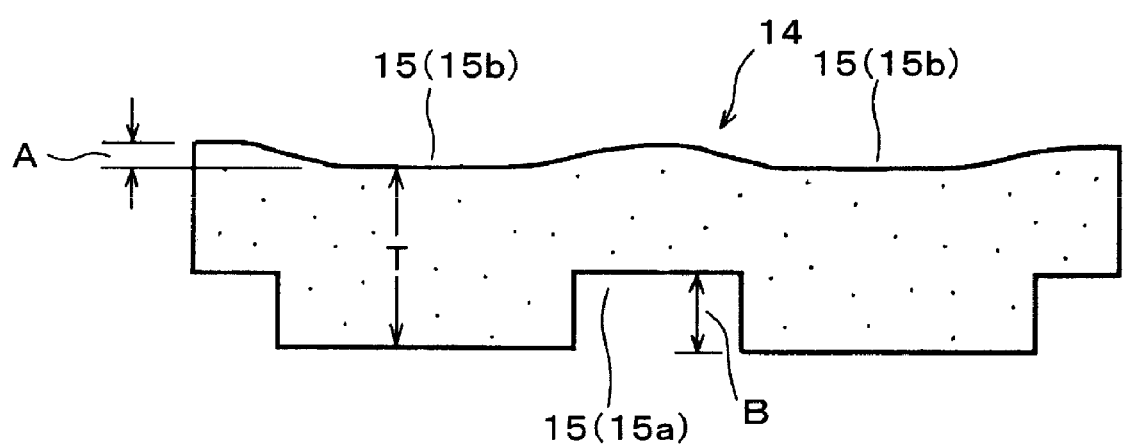
FIG. 12 is an illustration of a ceramic substrate produced in accordance with a preferred embodiment, showing in particular the depth of a cavity formed in the obverse side of the substrate without contacting the die, in relation to the height of a projection of the die and the thickness of the ceramic substrate.

FIG. 12 in cooperation with Table 1 shows the relationship among the depth A of the recess 15 (15b) at the obverse side of the fired ceramic substrate 14, and the height B of the projection 22 of the die 30 and the thickness T of the ceramic substrate 14, which are shown in FIGS. 10 and 11B.

TABLE 1

| Thickness T of Ceramic Substrate (μm) | Depth A of Recess 15 (15b) at Obverse Side of Ceramic Substrate (μm) | | |
|---|---|---|---|
| | Height B of Die Projection 22 (μm) 300 | Height B of Die Projection 22 (μm) 200 | Height B of Die Projection 22 (μm) 100 |
| 500 | 148 | 96 | 28 |
| 800 | 110 | 67 | 15 |

As shown in Table 1, when the height B of the projection 22 of the die 30 is about 100 μm, and the thickness T of the ceramic substrate 14 is about 800 μm, the depth A of the recess 15 (15b) on the obverse side of the ceramic substrate becomes about 15 μm which is equivalent to the surface roughness (10 μm to about 20 μm) of the ceramic substrate 14. The ceramic substrate 14 can therefore be obtained in which the sharply-shaped step portion (recess) 15 (15a) having almost vertical side wall surfaces is formed in only one surface, while the surface opposite thereto is flat, as shown in FIG. 11B.

The described process of the third preferred embodiment for producing a ceramic substrate produces advantages equivalent to those obtained with the ceramic substrate production process of the first preferred embodiment also in other respects. In addition, the described process of the third preferred embodiment for producing a ceramic substrate can be applied to that of the above-described second preferred embodiment (in which the die 30 (see FIG. 9) formed of a resin having an appropriate hardness, or a metal is used) to achieve advantages equivalent to those offered by the process of the second preferred embodiment for producing a ceramic substrate.

Although press-bonding is performed using the elastic member 7a, press-bonding may be effected by a hydrostatic pressure pressing method.

The process also may be modified such that, after being deformed by press-bonding using the elastic member 7a, the press-bonded body 13 is subjected to a further press-bonding effected by a hydrostatic pressure pressing method. In this case, the principal surface of the deformed press-bonded body 13 having the step portion (recess) 15 (15a) is preferably press-bonded via an easily-deformable elastic member (such as a silicone rubber) so as to isotropically receive the bonding pressure.

Fourth Preferred Embodiment

Figure 13:
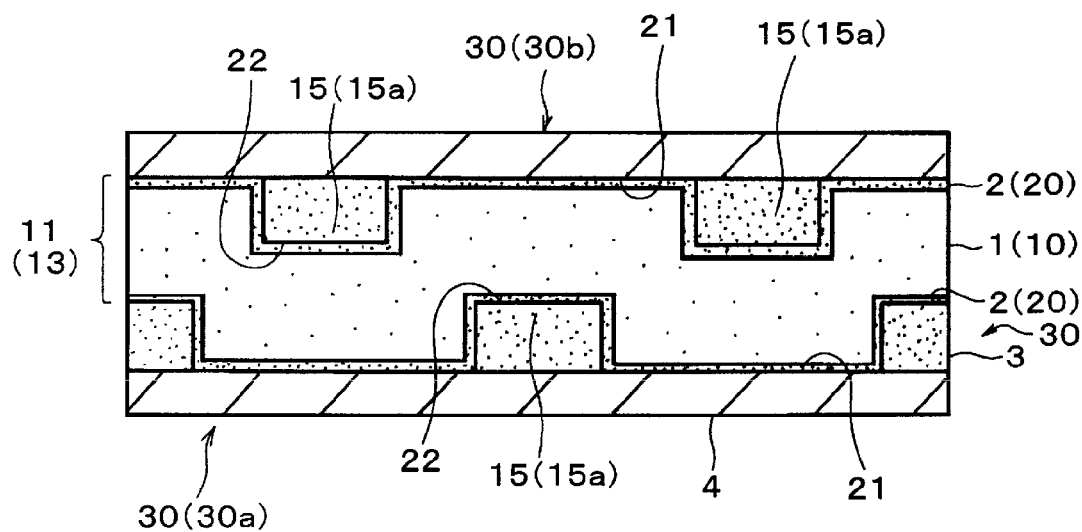
FIG. 13 illustrates a step of a process according to a further preferred embodiment of the ceramic substrate production process of the present invention.

FIG. 13 shows one step of a ceramic substrate production process in accordance with a further preferred embodiment of the present invention.

In FIG. 13, elements designated with the same reference numerals as those in FIGS. 1 and 2 indicate elements which are the same as or corresponding to those shown therein.

Features of the fourth preferred embodiment other than that described below are similar to those of first preferred embodiment described before.

As shown in FIG. 13, the fourth preferred embodiment uses a pair of pressing (deforming) dies 30 (30a and 30b) placed at predetermined positions on two principal surfaces of a laminate structure (auxiliary-layer-lined unfired ceramic body) 11 including an unfired ceramic body 10 and auxiliary layers 20 provided on obverse and reverse sides thereof. A pressing operation is performed through the die 30*b* on the obverse side, by a hydrostatic pressing (or press-bonding using an elastic member) method, so that a press-bonded body 13 having step portions 15 is formed.

In the fourth preferred embodiment, as in the case of the first preferred embodiment described before, the dies 30 (30*a* and 30*b*) are used which are formed by adhering to a flat plate 4 die-forming green sheets 3 prepared by punching out sheets which are the same as those of auxiliary layer (constraining layer) green sheets 2 into a predetermined shape.

The pressing pressure preferably ranges from about 100 kg/cm$^2$ to about 2,000 kg/cm$^2$ and more preferably from about 1,000 kg/cm$^2$ to about 2,000 kg/cm$^2$, while the pressing temperature preferably ranges from about 30° C. to about 100° C. and more preferably from about 50° C. to about 80° C.

The described process of the fourth preferred embodiment makes it possible to produce a press-bonded body 13 (deformed auxiliary-layer-lined unfired ceramic body 11) having step portions (recesses) 15 (15*a*) on two surfaces, the step portions each having almost vertical side wall surfaces and a sharp shape. By firing this press-bonded body 13, a ceramic substrate can be obtained which has the sharp-shaped step portions (recesses) 15 (15*a*) on the two surfaces thereof.

In accordance with the described process of the fourth preferred embodiment for producing a ceramic substrate, the step portions (recesses) 15 (15*a*) each having almost vertical side wall surfaces and a sharp shape are formed in the two surfaces of the laminate structure (auxiliary-layer-lined unfired ceramic body) 11. This preferred embodiment, therefore, fails to provide one of the advantages offered by the preceding first to third preferred embodiments in which one principal surface of the auxiliary-layer-lined unfired ceramic body 11 (the principal surface which does not contact the die 30) is gently deformed to relieve any stress which is generated in the other principal surface (surface contacted by the die 30) during forming the sharply-shaped step portions with almost vertical side wall surfaces. The process of the fourth preferred embodiment, however, produces almost the same advantages as those of the preceding preferred embodiments, in other respects.

The features of the ceramic substrate production process of the fourth preferred embodiment are applicable to the ceramic substrate production processes of the foregoing second preferred embodiment and third preferred embodiment, achieving advantageous effects similar to those offered by these preceding preferred embodiments.

Firth Preferred Embodiment

Figure 14:
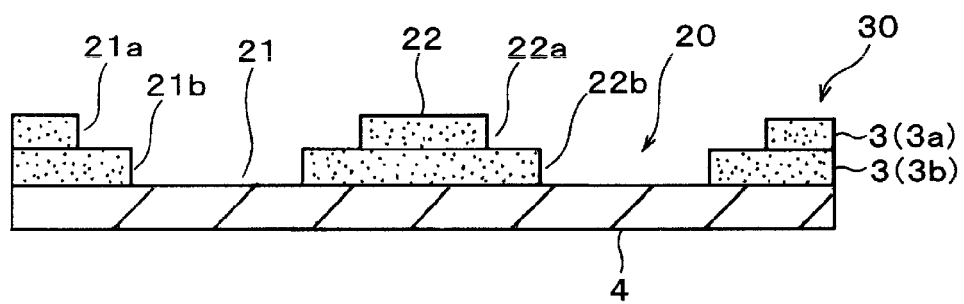
FIG. 14 illustrates a die used in a process according to a still further preferred embodiment of the ceramic substrate production process of the present invention.
Figure 15:
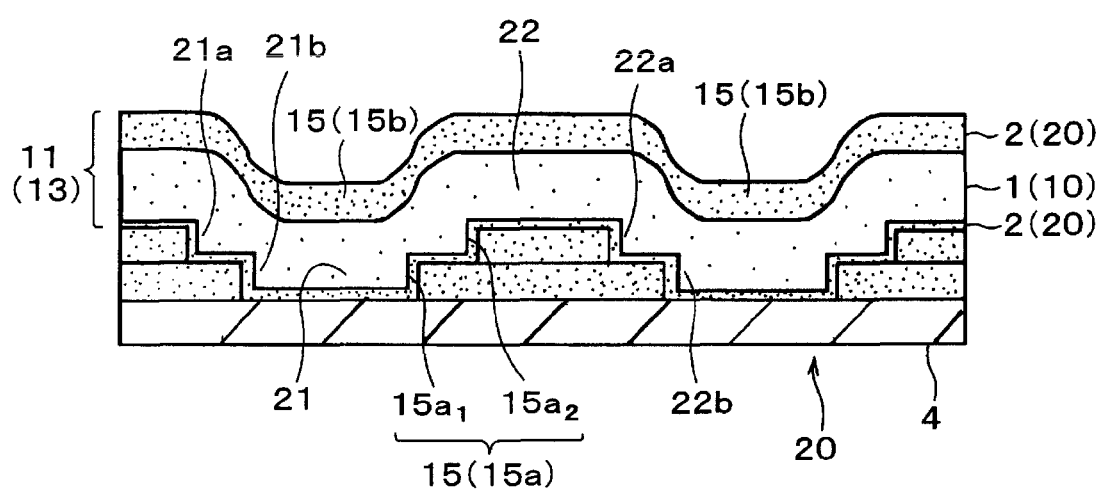
FIG. 15 shows a ceramic substrate production process with step portions each having more than one step, by using the die shown in FIG. 14.

FIG. 14 shows the structure of a die used in a ceramic substrate production process in accordance with a still further preferred embodiment of the present invention. FIG. 15 illustrates a process for producing, by using the die shown in FIG. 14, a ceramic substrate having a plurality of step portions. In FIGS. 14 and 15, same reference numerals are used to denote the same or corresponding elements as those used in FIGS. 1 and 2.

Features of the fifth preferred embodiment other than those specifically described below are the same as those of the first preferred embodiment described before.

Referring to FIG. 14, the process of the fifth preferred embodiment preferably uses a die 30 in which each of recesses 21 has a plurality of steps (two steps) 21*a*, 21*b* and each of projections 22 has a plurality of steps (two steps) 22*a*, 22*b*.

In order to obtain the die 30 in which each of recesses 21 has a plurality of steps (two steps) 21*a*, 21*b* and each of projections 22 has a plurality of steps (two steps) 22*a*, 22*b*, two types of die forming green sheets 3 (3*a*, 3*b*) are prepared by punching from sheets which are the same as the auxiliary layer (constraining layer) green sheets 2 (see FIG. 15). These die-forming green sheets 3*a* are then adhered to a flat plate 4 and the other die-forming sheet 3*b* is adhered to the sheet 3*a*.

Obviously, it is possible to obtain a die in which each recess and each projection has three or more steps, by preparing three or more patterns with which the auxiliary layer (constraining layer) green sheets are punched (i.e., three or more types of die-forming green sheets 3).

It is also possible to use a die 30 which is prepared, as is the case of the die 30 used in the second preferred embodiment (see FIG. 9), by forming recesses 21 and projections 22 of predetermined shapes directly on a flat plate 4 of a material having an appropriate hardness (e.g., a resin or a metal).

Press-bonding operation is performed by a hydrostatic pressing method (or press-bonding effected through an elastic medium) on a laminated structure (auxiliary-layer-lined unfired ceramic body) 11 by using the described die 30 (FIG. 14) in a manner shown in FIG. 15. As a result, a press-bonded body 13 is obtained in which the surface thereof contacted by the die 30 has step portions 15 (15*a*) each having two steps 15*a*1 and 15*a*2 on each side wall and the surface thereof kept out of contact with the die 30 has gently-shaped step portions 15 (15*b*). Consequently, it is possible to produce a ceramic substrate of a geometry corresponding to that of the press-bonded body 13.

Figure 16:
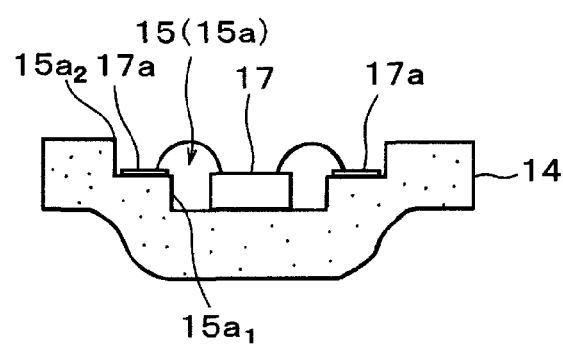
FIG. 16 shows a ceramic substrate having a cavity each side wall of which has two steps, produced in accordance with a preferred embodiment of the present invention.

The ceramic substrate (mother board) thus obtained is cut at predetermined portions thereof, so that a plurality of ceramic substrates are obtained each having, as shown in FIG. 16, a recess 15*a* with two steps 15*a*1, 15*a*2 in each side wall thereof.

The ceramic substrate 14 produced by the described process offers an advantage in that wire bonding pads 17*a* which are used when mounting a semiconductor device 17 can be formed at a level corresponding to the height of the semiconductor device 17, allowing a stable wire bonding operation.

The process of the fifth preferred embodiment for producing a ceramic substrate produces advantages similar to those achieved by the first preferred embodiment described before, also in other respects. It is also to be understood that the described process of the fifth preferred embodiment for producing a ceramic substrate can be applied to any of the processes of the preceding second to fourth preferred embodiments, achieving the same advantageous effects as those offered by these preceding preferred embodiments.

Sixth Preferred Embodiment

Figure 17:
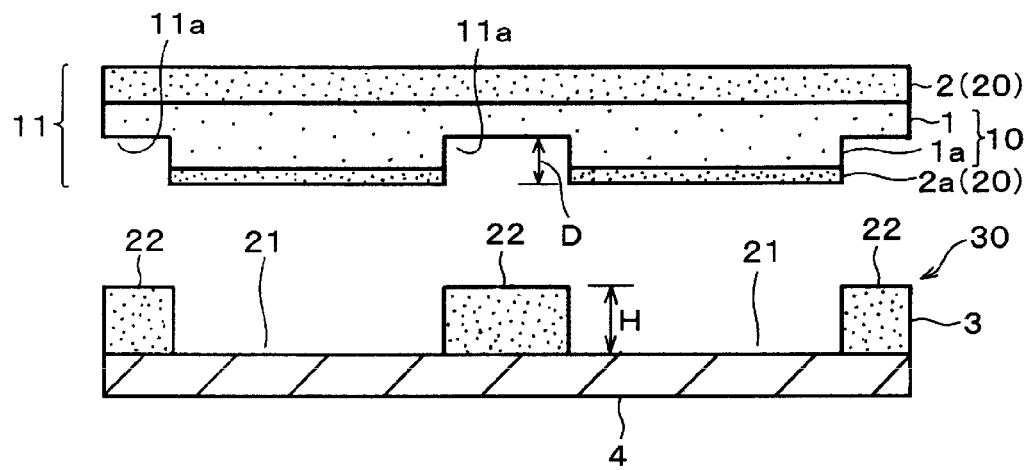
FIG. 17 shows a die used in a yet further preferred embodiment of the ceramic substrate production process of the present invention, and shows also an auxiliary-layer-lined unfired ceramic body, formed in a shape complementary to the shape of the die in advance to a press work.
Figure 18:
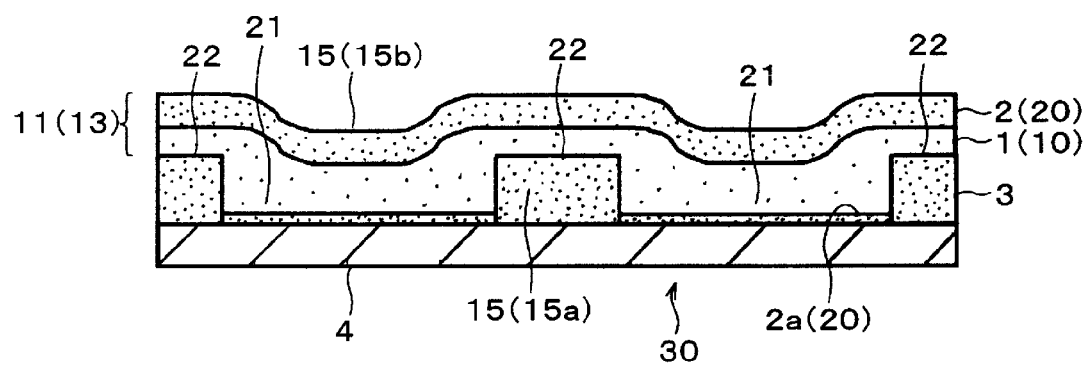
FIG. 18 shows the auxiliary-layer-lined unfired ceramic body under a press work executed in accordance with a preferred embodiment of the present invention.

FIG. 17 shows a die to be used in a ceramic substrate production process in accordance with a still further preferred embodiment of the present invention, together with an auxiliary-layer-lined unfired ceramic body, the unfired ceramic body having been shaped complementarily to the die and held in a state prior to firing. FIG. 18 shows the auxiliary-layer-lined unfired ceramic body under pressing operation. In FIGS. 17 and 18, reference numerals which are the same as those appearing in FIGS. 1 and 2 denote the same or corresponding parts as those shown in FIGS. 1 and 2.

Features of the sixth preferred embodiment other than those described below are similar to those of first preferred embodiment described before.

The sixth preferred embodiment 6 preferably uses, as in the case of the first preferred embodiment, the die 30 (see FIG.

17) which has recesses 21 and projections 22 and which is obtained by adhering to a flat plate 4 a die forming green sheet 3 prepared by punching from a sheet which is the same as the auxiliary layer (constraining layer) green sheet 2.

A laminate structure (auxiliary-layer-lined unfired ceramic body) 11 is formed by laminating a predetermined number of non-punched auxiliary layer (constraining layer) green sheets 2 and a predetermined number of non-punched substrate green sheets 1 and, thereafter, laminating punched substrate green sheets 1a and punched auxiliary layer (constraining layer) green sheets 2a. Thus, the laminate structure (auxiliary-layer-lined unfired ceramic body) 11 is formed to have an unfired ceramic body 10 and auxiliary layers 20 disposed on two principal surfaces of the unfired ceramic body 10, with a recess 11a formed at a position corresponding to each of the projections 22 of the die 30 (see FIG. 17).

The depth D of the recess 11a formed in the laminate structure (auxiliary-layer-lined unfired ceramic body) 11 is determined to be smaller than the height H of the projection (die) 22 of the die 30 so that the bottom of the recess 11a is pressed (press-bonded) by the projection 22 of the die 30 to provide a step portion (recess) 15 (15a) of a predetermined shape.

Then, as shown in FIG. 18, the die 30 is arranged such that the projection 22 of the die 30 opposes to the recess 11a of the laminate structure (auxiliary-layer-lined unfired ceramic body) 11, and a pressing operation is performed by a hydrostatic press (or by press-bonding through an elastic medium). Consequently, a press-bonded body 13 is obtained in which a deep and sharply-shaped step portion (recess) 15 (15a) with almost vertical side walls is formed in the surface facing the die 30, while the opposite surface kept out of contact with the die 30 has a step portion (recess) 15 (15b) having gently slanted side walls and a depth smaller than that of the recess 15 (15a) formed in the surface facing the die 30.

In the process of the sixth preferred embodiment, a recess 11a is formed in advance in the laminate structure (auxiliary-layer-lined unfired ceramic body) 11 at a location where the recess 15 (15a) is to be formed in the ceramic substrate as the final product. By effecting a pressing operation after matching the die 30, it is possible to form, with a high degree of reliability, a deep and sharply-shaped step portion (recess) 15 (15a) with a reduced thickness of the portion where the recess 15 (15a) is formed (bottom of the recess 15a).

It is also to be appreciated that a press-bonded body 13, provided with a deep and sharply-shaped step portion (recess) 15 (15a) with a reduced thickness of the portion where the recess 15 (15a) (bottom of the recess 15a), can be produced at a high yield by the press operation performed by using the die 30, despite the large depth of the recess 15 (15a), without being hampered by breakage of the unfired ceramic body 10. This is due to the fact that the recess 11a is previously formed in the laminate structure (auxiliary-layer-lined unfired ceramic body) 11.

The described process of the sixth preferred embodiment for producing a ceramic substrate offers, beside the above-described advantage, similar advantages as those produced by the process of the first preferred embodiment for producing a ceramic substrate. It is also to be understood that the described process of the first preferred embodiment for producing a ceramic substrate can be applied to any of the processes of the preceding second to fifth preferred embodiments, achieving the same advantageous effects as those offered by these preceding preferred embodiments.

Seventh Preferred Embodiment

Figure 19:
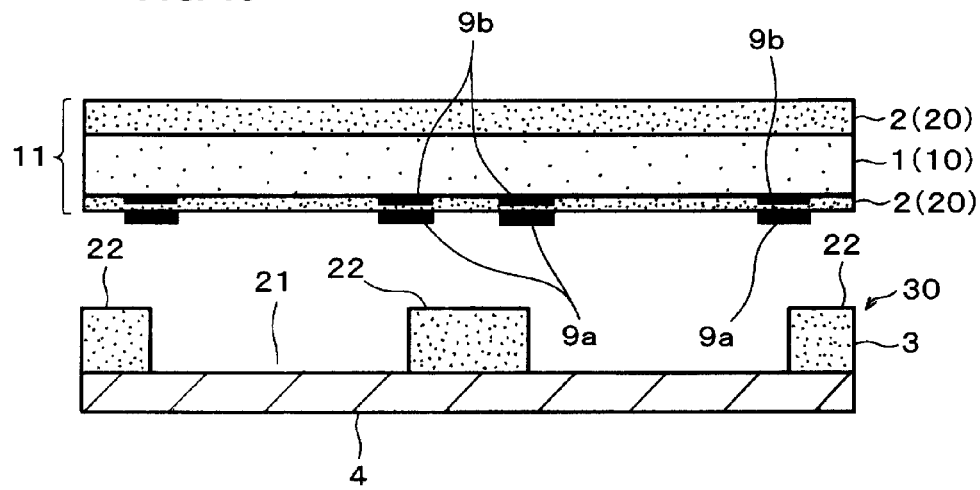
FIG. 19 shows a die used in a yet further preferred embodiment of the ceramic substrate production process of the present invention, and shows also an auxiliary-layer-lined unfired ceramic body, formed in accordance with the complementary configuration of the die in advance to a press work.
Figure 20:
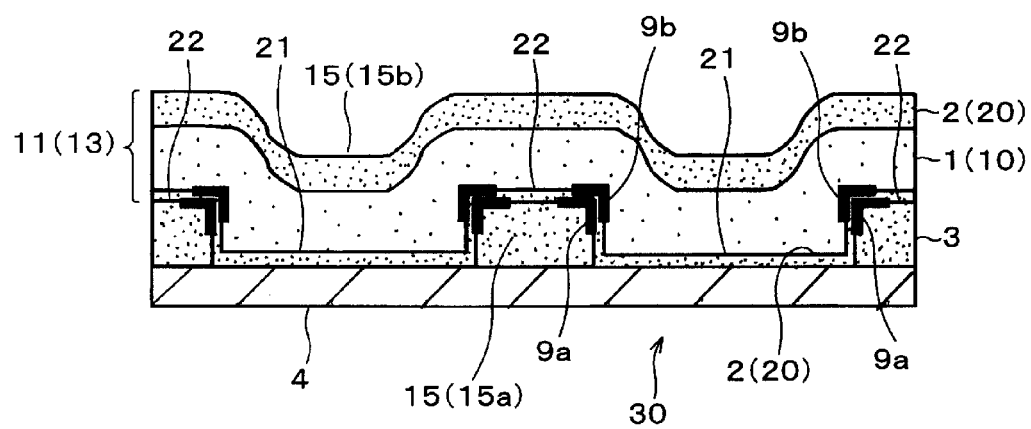
FIG. 20 shows the auxiliary-layer-lined unfired ceramic body under a press work executed in accordance with a preferred embodiment of the present invention.

FIG. 19 shows a die to be used in a ceramic substrate production process in accordance with a still further preferred embodiment of the present invention, together with an auxiliary-layer-lined unfired ceramic body, the unfired ceramic body having been shaped complementarily to the die and held in a state prior to firing. FIG. 20 shows the auxiliary-layer-lined unfired ceramic body under pressing operation.

In FIGS. 19 and 20, reference numerals which are the same as those appearing in FIGS. 1 and 2 denote the same or corresponding elements as those shown in FIGS. 1 and 2.

Features of the seventh preferred embodiment other than those described below are similar to those of the first preferred embodiment described before.

The seventh preferred embodiment preferably uses, as in the case of the first preferred embodiment, a die 30 (see FIG. 19) which has recesses 21 and projections 22 and which is obtained by adhering to a flat plate 4 die forming green sheets 3 prepared by punching from sheets which are the same as the auxiliary layer (constraining layer) green sheets 2.

A laminate structure (auxiliary-layer-lined unfired ceramic body) 11 is formed by laminating in a predetermined order a required number of substrate green sheets 1 and a required number of auxiliary layer (constraining layer) green sheets 2. Thus, the laminate structure (auxiliary-layer-lined unfired ceramic body) 11 is formed to have an unfired ceramic body 10 and auxiliary layers 20 disposed on two principal surfaces of the unfired ceramic body 10 (see FIG. 19).

The seventh preferred embodiment preferably uses reinforcement layer segments 9a, 9b which are made of a material resistant to deformation and cracking of the laminate body 11 (e.g., glass paste, metal conductor paste, organic buffer material, or the like) and which are disposed in the regions which are subjected to bending during pressing (press-bonding). These regions are portions of the laminate structure (auxiliary-layer-lined unfired ceramic body) 11 and areas therearound, specifically the portions of the surface of the auxiliary layer 20 facing the die 30, as well as portions of the unfired ceramic body 10, which oppose to edges of each projection 22 of the die 30, and areas therearound.

The reinforcement layer segments 9a, 9b can be formed by applying in a predetermined pattern a reinforcement layer paste to the auxiliary layer (constraining layer) green sheet 2 and also to the substrate green sheet 1, by a screen printing technique or the like. The reinforcement layer paste may be a conductor paste which is the same as that used for forming the external conductor 31, internal conductor 32 and via hole conductor 34, although a different material may be used.

Then, the die 30 is stationed to match the laminate structure (auxiliary-layer-lined unfired ceramic body) 11, and a pressing operation is performed by a hydrostatic press (or by press-bonding through an elastic medium). Consequently, a press-bonded body 13 is obtained in which a sharply-shaped step portion (recess) 15 (15a) with almost vertical side walls is formed in the surface facing the die 30, while the opposite surface kept out of contact with the die 30 has a step portion (recess) 15 (15b) having gently slanted side walls.

In the seventh preferred embodiment as described, reinforcement layer segments 9a, 9b resistant to deformation and cracking of the laminate structure (auxiliary-layer-lined unfired ceramic body) 11 are disposed beforehand on the portions of the laminate structure 11 which are susceptible to bending and, hence, to large deformation during the pressing (deforming) step. It is therefore possible to eliminate or suppress generation of defects such that breakage of the external and internal conductors, cracking of the ceramic green sheet constituting the unfired ceramic body 10, and so on, even when the press-bonded body 13 is formed to have large-sized step portions.

The described ceramic substrate production process of the seventh preferred embodiment produces advantages similar to those offered by the other preferred embodiments of the present invention also in other respects. The feature of the ceramic substrate described in connection with the seventh preferred embodiment is applicable to preceding second to sixth preferred embodiments, thereby providing advantages similar to those produced by these preceding preferred embodiments.

Eighth Preferred Embodiment

Figure 21:
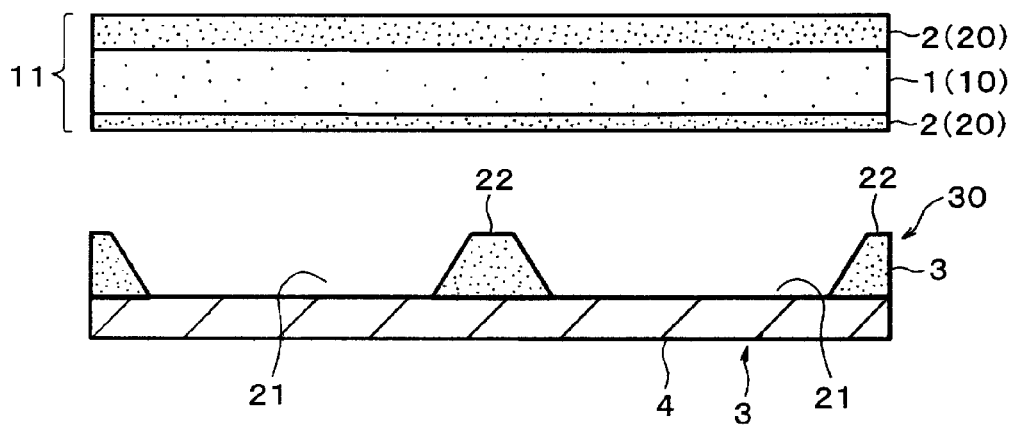
FIG. 21 shows a die used in a yet further preferred embodiment of the ceramic substrate production process of the present invention, and shows also an auxiliary-layer-lined unfired ceramic body, before being subjected to a press work.
Figure 22:
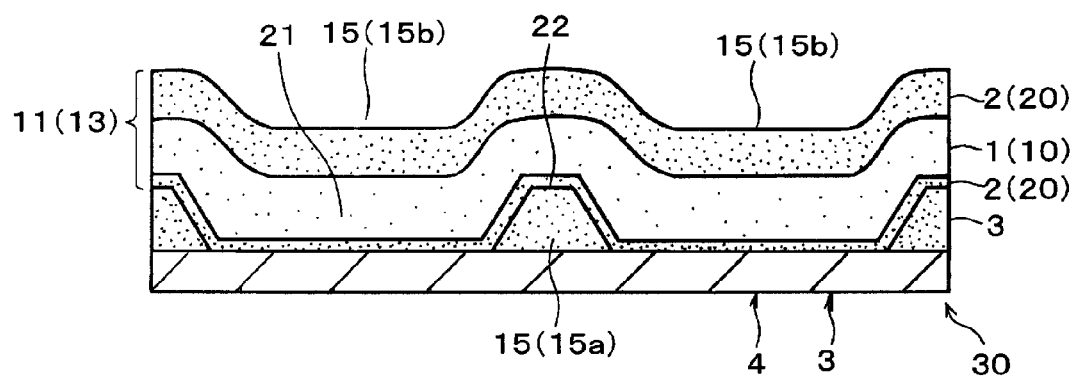
FIG. 22 shows a process for producing a ceramic substrate having a tapered step portion by using the die shown in FIG. 21.

FIG. 21 shows a die used in a ceramic substrate production process in accordance with a yet further preferred embodiment of the present invention, while FIG. 22 is an illustration of the ceramic substrate production process using the die shown in FIG. 21.

In FIGS. 21 and 22, the same reference numerals as those appearing in FIGS. 1 and 2 are used to denote portions which are the same or corresponding to those in FIGS. 1 and 2.

Features of the eighth preferred embodiment other than those specifically described below are equivalent to those of the first preferred embodiment described before.

The eighth preferred embodiment preferably uses a die 30 having upwardly converging (downwardly diverging) tapered projections 22 and upwardly diverging (downwardly converging) tapered recesses 21 (see FIG. 21). This die 30 is formed by adhering to a flat plate 4 die-forming green sheets 3 which are prepared by punching from the same sheets as the auxiliary layer (constraining layer) green sheets 2 in a predetermined pattern such that the side wall surfaces formed as a result of the punching are slanted.

A predetermined number of substrate green sheets 1 and a predetermined number of auxiliary layer (constraining layer) green sheets 2 are laminated in a predetermined order, whereby a laminate structure (auxiliary-layer-lined unfired ceramic body) 11 is prepared to have an unfired ceramic body 10 and auxiliary layers disposed on both sides of the unfired ceramic body 10 (see FIG. 21).

Then, as shown in FIG. 22, the die 30 is stationed at the right position with respect to the laminate structure (auxiliary-layer-lined unfired ceramic body) 11, and a pressing operation is performed by a hydrostatic pressing method (or by press-bonding through an elastic medium), whereby a press-bonded body 13 having step portions 15 is obtained.

It is thus possible to obtain the press-bonded body 13 in which the surface thereof facing the die 30 has sharp tapered step portions (recesses) 15 (15a) defined by slanted side walls and having cross-sectional area decreasing toward the bottom, while the surface thereof kept out of contact with the die 30 has step portions (recesses) 15 (15a) defined by gently slanted side walls.

In contrast to the foregoing first preferred embodiment in which step portions (recesses) 15 (15a) have almost vertical side walls, the eighth preferred embodiment as described provides step portions (recesses) 15 (15a) each having a sharp tapered form defined by slanted side walls and reducing cross-sectional area toward the bottom thereof. The recess 15a formed in accordance with the process of the eighth preferred embodiment for producing a ceramic substrate has smaller internal volume and smaller mounting area (bottom area) as compared to the step portion (recess) 15a formed in accordance with the process of the first preferred embodiment. The process of the first preferred embodiment, however, involves a risk of deep cracking in the surface of the laminate structure 11, because the laminate structure undergoes a large deformation (bending) causing a portion thereof to be strongly stretched, in order that a deep recess 15 (15a) is formed. In contrast, the process of the eighth preferred embodiment for producing a ceramic substrate, which uses the die 30 having converging tapered projection 22, allows to reduce the angle at which the laminate structure (auxiliary-layer-lined unfired ceramic body) is bent. It is therefore possible to reduce or eliminate the risk of cracking in the laminate structure 11, even when recesses 15 (15a) of a large depth are to be formed and, accordingly, to produce reliable ceramic substrate products at a high yield.

Figure 23:
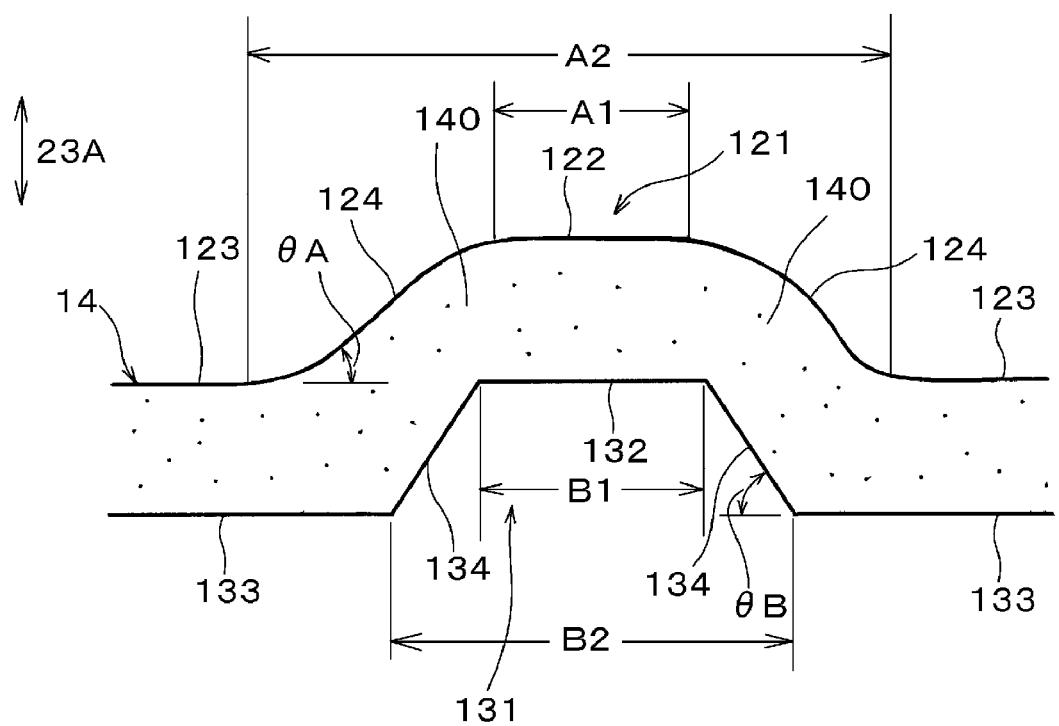
FIG. 23 is an enlarged sectional view of a ceramic substrate produced in accordance with a preferred embodiment of the ceramic electronic component producing process according to a preferred embodiment of the present invention, showing in particular a critical portion of the ceramic substrate.
Figure 24A:
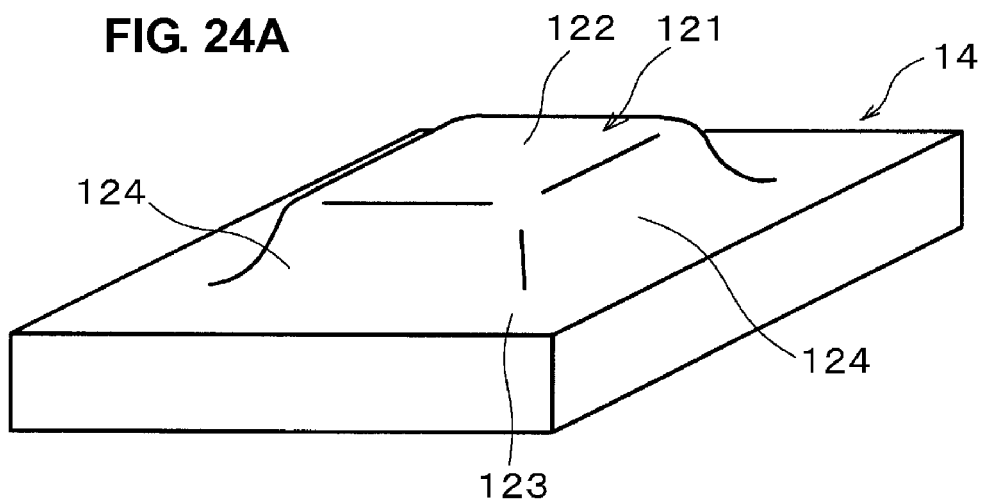
Figure 24B:
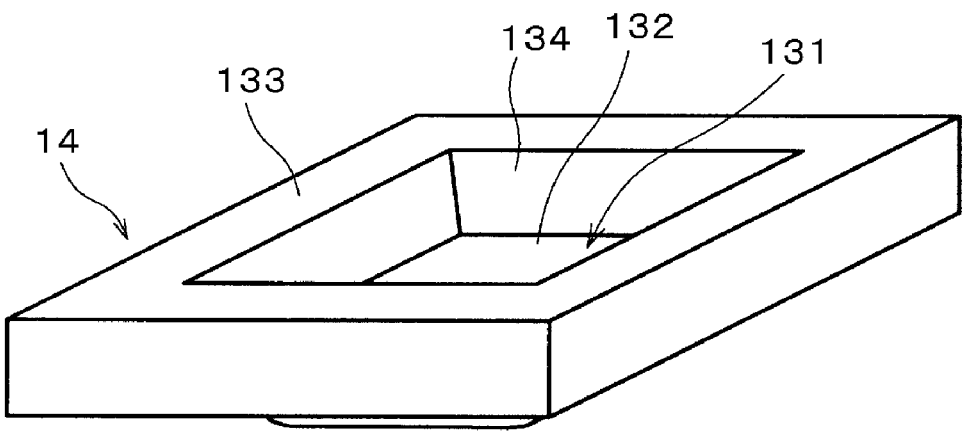
FIG. 24B is a perspective view showing the configuration of the lower side of the ceramic substrate.

FIG. 23 is an enlarged sectional view of a critical portion of a ceramic substrate produced in accordance with an electronic component producing process in accordance with the eighth preferred embodiment. FIG. 24A is a perspective view of the ceramic substrate of FIG. 23 showing the shape of the obverse side of the ceramic substrate. FIG. 24B is a perspective view showing the shape of the reverse side of the ceramic substrate.

It will be seen from FIGS. 23, 24A and 24B that the ceramic substrate 14 (or the press-bonded body 13) produced by the electronic component producing process of the eighth preferred embodiment satisfies the following conditions defined by the following factors:

(a) Symbol A1 represents the dimension of the substantially flat surface 122 of the top of a projection 121 formed on the obverse side, as measured in a direction that is parallel or substantially parallel to the obverse surface 123 of the ceramic substrate 14.

(b) Symbol A2 represents the dimension of the entirety of the projection 121 formed on the obverse side, as measured in a direction that is parallel or substantially parallel to the obverse surface 123 of the ceramic substrate 14.

(c) Symbol θA represents an angle formed between slant portion 124 of the projection 121 on the obverse side and the obverse surface 123 of ceramic substrate 14.

(d) Symbol B1 represents the dimension of the substantially flat inner bottom surface 132 of a recess 131 formed in the reverse side, as measured in a direction that is parallel or substantially parallel to the reverse surface 133 of the ceramic substrate 14.

(e) Symbol B2 represents the dimension of the entirety of the recess 131 formed in the obverse side, as measured in a direction parallel to the reverse surface 133 of the ceramic substrate 14.

(f) Symbol θB represents an angle formed between inner wall (side wall) surface 134 of the recess 131 formed in the reverse side and the reverse surface 133 of the ceramic substrate 14.

Then, the ceramic substrate 14 (or press-bonded body 13) are formed to satisfy the following conditions.

$$A1 < B1 \quad [1]$$

$$B2 < A2 \quad [2]$$

In the description of the eighth preferred embodiment, the term "substantially flat top surface of projection" means a surface area defined by a contour line that is about 20 μm lower than the highest point of the top surface. The term "dimension A1 of the substantially flat top surface as measured in direction parallel to obverse surface of ceramic substrate" means the dimension of the above-mentioned surface area as measured in a direction that is parallel or substantially parallel to obverse surface of ceramic substrate.

The term "dimension A2 of the entirety of the projection formed on the obverse side, as measured in a direction parallel to the obverse surface of the ceramic substrate" means the full length of the protruding area which is defined by a contour line that is about 10 μm higher than the obverse surface of the ceramic substrate, as measured in a direction that is parallel or substantially parallel to the obverse surface of the ceramic substrate.

The ceramic substrate 14 (or press-bonded body 13) also satisfies the following condition:

$$\theta A < \theta B \quad [3]$$

The following conditions are also met by the ceramic substrate 14 (or press-bonded body 13).

$$0° < \theta B \leq 90° \quad [4]$$

$$0° < \theta A \leq 90° \quad [5]$$

When the condition A1<B1 (condition [1]) and the condition B2<A2 (condition [2]) are met, the thickness of a step forming portion 140 of the ceramic substrate 14 between the projection 121 and the recess 131 as measured in a contracting direction (direction indicated by an arrow 23A in FIG. 23) is held to approximately equal to the thickness of the remainder portion of the ceramic substrate 14. This effectively suppresses or prevents development of large difference or variation in the absolute amount of contraction which appears in the course of firing, affording a ceramic substrate 14 having a cavity structure (structure with the recess 131) substantially free of defect such as strain and cracking.

At the same time, it is possible to suppress or eliminate any delamination tendency occurring at the interface between the press-bonded body 13 (ceramic substrate 14) and the auxiliary layer 20 (constraining layer green sheet 2) on each side of the press-bonded body 13. The above-mentioned tendency is attributable to the fact that the auxiliary layer 20 (constraining layer green sheet 2) maintains its shape without substantial contraction in the course of the sintering. Meanwhile, the press-bonded body 13 can be sintered without exhibiting substantial contraction in the plane directions while being allowed to contract in the thicknesswise direction. It is therefore possible to produce a ceramic substrate 14 having a cavity structure (structure having the recess 131) formed at a high dimensional precision.

The cavity structure can be formed without requiring any additional step and, therefore, a ceramic substrate 14 having such a cavity structure formed at a high dimensional precision can be produced without causing substantial rise of the production cost over the cost incurred in the production of ordinary flat ceramic substrates having no cavity structure.

When the condition $\theta A < \theta B$ (condition [3]) is met, the thickness of the step forming portion 140 of the ceramic substrate 14 between the projection 121 and the recess 131 can more reliably approximate the thickness of the remainder portion of the ceramic substrate 14, whereby the above-described advantageous effects are assured.

When the condition $0° < \theta B \leq 90°$ (condition [4]) and the condition $0° < \theta A \leq 90°$ (condition [5]) are met, the ceramic substrate 14 between the projection 121 and the recess 131 can much more reliably approximate the thickness of the remainder portion of the ceramic substrate 14, whereby the above-described advantageous effects are further assured.

The above-described advantages can be much more assured when a condition $30° \leq \theta B \leq 60°$ is met.

Figure 25:
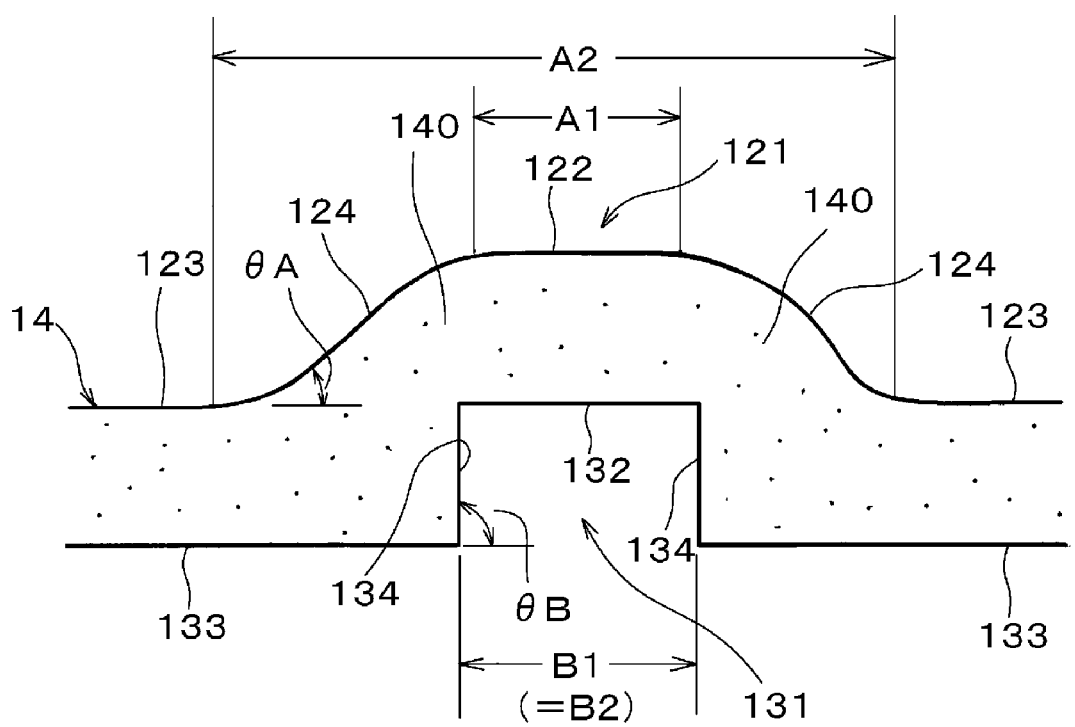
FIG. 25 is an enlarged sectional view of a modification of the ceramic substrate produced in accordance with a preferred embodiment of the ceramic electronic component producing process of the present invention, showing in particular a critical portion of the ceramic substrate.
Figure 26A:
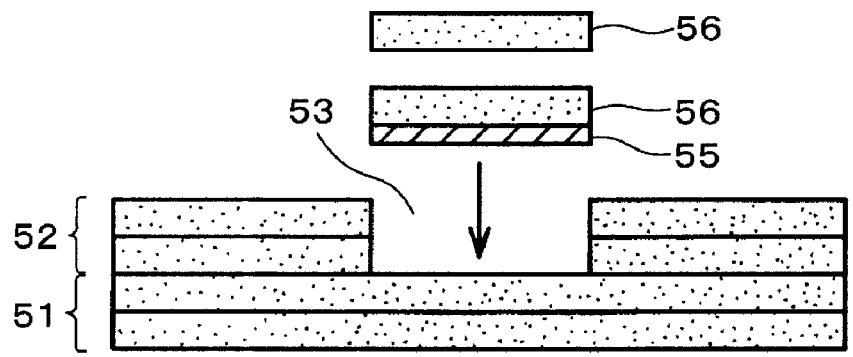
FIGS. 26A, 26B and 26C are illustrations of a known process for producing a ceramic substrate process having a step portion.
Figure 26B:
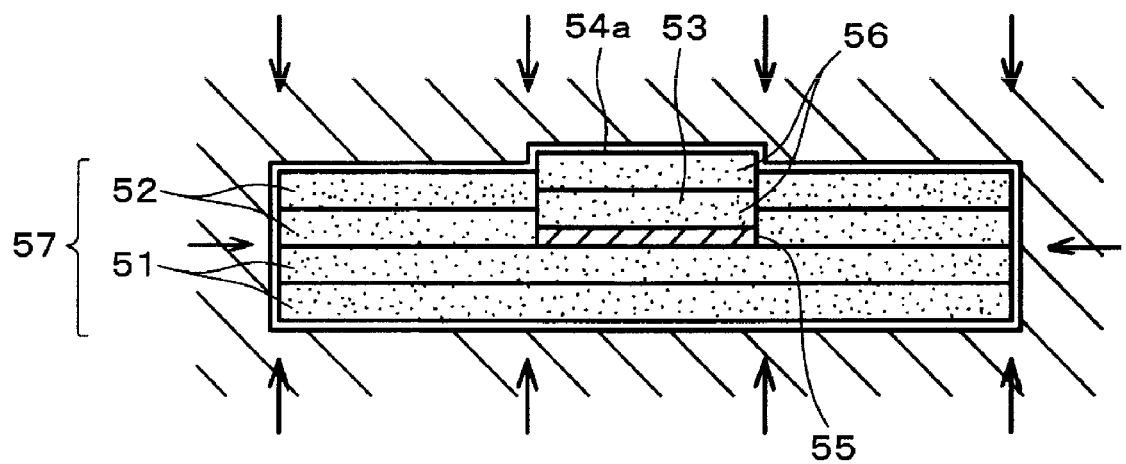
Figure 26C:
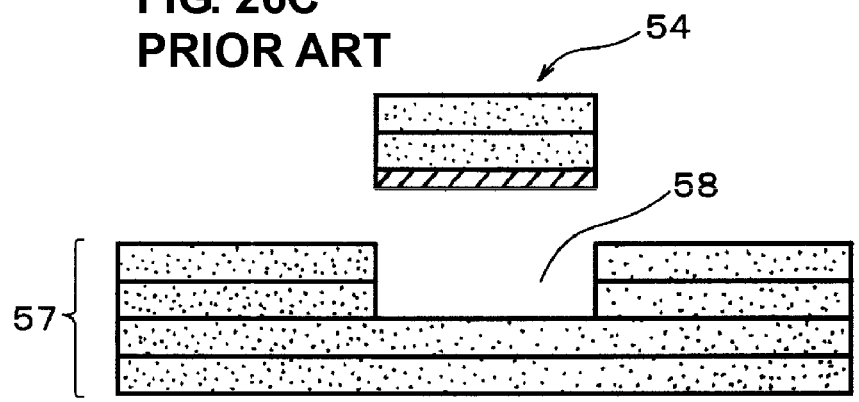

In various preferred embodiments of the present invention, the ceramic substrate 14 as the product may be produced such that the angle $\theta B$ formed between the inner wall surface 134 of the recess 131 formed in the reverse side and the reverse surface of the ceramic substrate 14 is 90°, as shown in FIG. 25.

Referring to FIG. 25, the shape of the projection 121 on the obverse side does not strictly follow the shape of the recess 131 formed in the reverse side. That is, a substantial difference exists between the shape of the recess in the reverse side and the shape of the projection 121 on the obverse side. In this structure, however, variation in the thickness of the ceramic substrate 14 is reduced, as the angle $\theta A$ formed between slant portion 124 of projection 121 on the obverse side and the obverse surface 123 of ceramic substrate 14 becomes more acute, due to the fact that the dimension A1 of the substantially flat top surface 122 is small whereas the dimension B2 (=B1 in this case) of the entirety of recess 131 in the reverse side is large when measured in direction that is parallel or substantially parallel to the reverse surface 133 of the ceramic substrate 14. In addition, the sheets constituting the press-bonded body 13 are stretched in the region around the projection 121 and the recess 131, so as to suppress thickening of the press-bonded body 13. Therefore, the advantageous effects produced by the eighth preferred embodiment are basically enjoyable, even when the angle $\theta B$ formed between the inner wall surface 134 of the recess 131 and the reverse surface of the ceramic substrate 14 is selected to be 90°.

With regards to other respects, the process of the eighth preferred embodiment for producing a ceramic substrate offers the same advantages as those derived from the process of first preferred embodiment described before. It is also to be understood that the features of the ceramic substrate in accordance with the eighth preferred embodiment can be applied to any of the processes of the preceding second to seventh preferred embodiments, achieving the same advantageous effects as those achieved by the processes for producing ceramic substrates in accordance with these preceding second to seventh preferred embodiments.

According to the ceramic substrate production process of various preferred embodiments of the present invention, an auxiliary-layer-lined unfired ceramic body, which is provided in a principal surface thereof with a step portion, is formed by adhering to a principal surface of an unfired ceramic body an auxiliary layer made of a material substantially unsinterable at a temperature at which the unfired ceramic body is fired. The auxiliary-layer-lined unfired ceramic body thus formed is fired while the auxiliary layer remains adhered to the unfired ceramic body. It is therefore possible to efficiently produce a ceramic substrate having a step portion of a desired shape without requiring complicated producing process steps and equipments.

The present invention therefore can be broadly applied to industrial fields such as ceramic substrates and module substrates composed of such ceramic substrates mounting various types of electronic devices, thus finding a variety of use.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A process for producing a ceramic substrate, comprising the steps of:
    forming an auxiliary-layer-lined unfired ceramic body comprising a plane-shaped unfired ceramic body and first and second auxiliary layers arranged to cover substantially the entire area of respective first and second principal surfaces of the unfired ceramic body from one edge of the unfired ceramic body to an opposed edge of the unfired ceramic body, the auxiliary layers being made of a material which is substantially unsinterable at a firing temperature of the unfired ceramic body;

deforming a predetermined region of the auxiliary-layer-lined unfired ceramic body, while the thickness of the unfired ceramic body is maintained over substantially the entire area thereof and while the adhesion between the unfired ceramic body and the auxiliary layers is maintained, so as to form a step portion on each of the first and second principal surfaces of the auxiliary-layer-lined unfired ceramic body, the step portion on one of the first and second principal surfaces of the auxiliary-layer-lined unfired ceramic body being formed to include substantially vertical and linear side walls and the step portion on the other of the first and second principal surfaces of the auxiliary-layer-lined unfired ceramic body being formed to include gently curved side walls; and subjecting the auxiliary-layer-lined unfired ceramic body having the step portion to firing conducted at a temperature at which the unfired ceramic body is sinterable but the auxiliary layers are substantially unsinterable, while the auxiliary layers remain adhered to the unfired ceramic body without being removed.

2. The process for producing a ceramic substrate according to claim 1, wherein, by performing pressing using a die which has a projection and which is arranged to face the side of the auxiliary-layer-lined unfired ceramic body retaining the auxiliary layers, the step portion is formed on the surface of the auxiliary-layer-lined unfired ceramic body retaining the auxiliary layers to have a shape that corresponds to an external shape of the projection.

3. The process for producing a ceramic substrate according to claim 2, wherein the pressing is performed using the die having the projection facing the side of the auxiliary-layer-lined unfired ceramic body retaining the auxiliary layers, by applying a pressure to the auxiliary-layer-lined unfired ceramic body from the side thereof opposite to the side facing the die having the projection, by a hydrostatic pressing method or through an elastic medium.

4. The process for producing a ceramic substrate according to claim 2, wherein the die having the projection comprises a plate-shaped support member and a projection-forming member which is disposed on the plate-shaped support member and which is made of a material that is substantially unsinterable at the firing temperature of the unfired ceramic body.

5. The process for producing a ceramic substrate according to claim 4, wherein the auxiliary-layer-lined unfired ceramic body having the step portion is fired while being kept in engagement with the projection-forming member.

6. The process for producing a ceramic substrate according to claim 2, wherein dies each having the projection are arranged to face a predetermined position on each of the two principal surfaces of the auxiliary-layer-lined unfired ceramic body, whereby step portions having shapes corresponding to the external shapes of the associated dies are formed in both principal surfaces of the auxiliary-layer-lined unfired ceramic body.

7. The process for producing a ceramic substrate according to claim 2, wherein the projection of the die has a plurality of steps, so that the step portion is formed in the auxiliary-layer-lined unfired ceramic body to have a shape corresponding to outer shape of the projection having the plurality of the steps.

8. The process for producing a ceramic substrate according to claim 2, wherein at least the projection of the die has a hardness greater than those of the unfired ceramic body and the auxiliary layers constituting the auxiliary-layer-lined unfired ceramic body and also has elasticity.

9. A process for producing a ceramic substrate according to claim 4, wherein the projection-forming member is formed through a pressing step in which the material of the die-forming member receives a pressure higher than that applied when forming the auxiliary-layer-lined unfired ceramic body.

10. The process for producing a ceramic substrate according to claim 2, wherein a reinforcement material is provided on at least a portion of the regions of the auxiliary-layer-lined unfired ceramic body which are subjected to deformation following the contour of the die projection.

11. The process for producing a ceramic substrate according to claim 1, wherein the unfired ceramic body is an unfired ceramic laminate structure formed of a laminate of a plurality of ceramic green sheets, and wherein an inter-layer conductor pattern providing electrical connection between different layers and a planar conductor pattern at an interface between adjacent layers are disposed inside the unfired ceramic laminate structure.

12. The process for producing a ceramic substrate according to claim 1, wherein the auxiliary-layer-lined unfired ceramic body having the adhered auxiliary layers is formed by adhering the auxiliary layers to a ceramic green sheet laminate structure prepared by laminating a plurality of ceramic green sheets and press-bonding the plurality of ceramic green sheets in a lump.

13. The process for producing a ceramic substrate according to claim 1, wherein the auxiliary-layer-lined unfired ceramic body having the adhered auxiliary layers is formed by adhering the auxiliary layers to a ceramic green sheet laminate structure prepared by a sequential press-bonding laminating method in which a plurality of ceramic green sheets are laminated while pressure bonding is performed upon stacking of each or a predetermined number of successive sheets.

14. The process for producing a ceramic substrate according to claim 2, wherein the auxiliary-layer-lined unfired ceramic body with the adhered auxiliary layers has a recess formed at a portion to be contacted by the projection of the die, the height of the projection being greater than the depth of the recess.

15. The process for producing a ceramic substrate according to claim 1, wherein the unfired ceramic body is a mother board for producing a plurality of substrates, and wherein the process comprises the step of dividing the mother board after the firing step into individual ceramic substrates.

16. The process for producing a ceramic substrate according to claim 1, further comprising the step of mounting a surface mount device on the ceramic substrate after the firing.

* * * * *